US008178169B2

(12) United States Patent
Domoto et al.

(10) Patent No.: US 8,178,169 B2
(45) Date of Patent: *May 15, 2012

(54) METHODS OF LEVELING INK ON SUBSTRATES USING FLASH HEATING AND APPARATUSES USEFUL IN PRINTING

(75) Inventors: Gerald A. Domoto, Briarcliff Manor, NY (US); Nicholas P. Kladias, Fresh Meadows, NY (US); Stephan Drappel, Toronto (CA); Gregory J. Kovacs, Webster, NY (US); Bryan J. Roof, Newark, NY (US); Stephen T. Knapp, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/764,488

(22) Filed: Apr. 21, 2010

(65) Prior Publication Data

US 2011/0262659 A1 Oct. 27, 2011

(51) Int. Cl.
*B05D 3/06* (2006.01)
*C23C 14/28* (2006.01)
*H05B 6/00* (2006.01)
*B41J 2/01* (2006.01)

(52) U.S. Cl. ......................... 427/558; 427/595; 347/102

(58) Field of Classification Search ................ 101/424.1
See application file for complete search history.

(56) References Cited

U.S. PATENT DOCUMENTS 7,559,639 B2 7/2009 Belelie et al.
2006/0066703 A1* 3/2006 Kadomatsu et al. .......... 347/102
2007/0120919 A1 5/2007 Goredema et al.
2007/0123606 A1 5/2007 Toma et al.
2009/0160924 A1* 6/2009 Pattekar et al. ............... 347/102

OTHER PUBLICATIONS

Roof et al.; "Dual-Web Apparatus for Fixing a Radiation-Curable Gel-Ink Image on a Substrate"; U.S. Appl. No. 12/256,684, filed Oct. 23, 2008.

Roof et al.; U.S. Appl. No. 12/256,670; "Method and Apparatus for Fixing a Radiation-Curable Gel-Ink Image on a Substrate", filed Oct. 23, 2008.

Roof et al.; "Apparatus for Fixing a Radiation-Curable Gel-Ink Image on a Substrate"; U.S. Appl. No. 12/256,690, filed Oct. 23, 2008.

Ferencz Jr.; "Fuser Assemblies, Xerographic Apparatuses and Methods of Fusing Toner on Media in Xerographic Apparatuses"; U.S. Appl. No. 12/130,051, filed May 30, 2008.

* cited by examiner

*Primary Examiner* — Michael Cleveland
*Assistant Examiner* — James M Mellott
(74) *Attorney, Agent, or Firm* — Ronald E. Prass, Jr.; Prass LLP

(57) ABSTRACT

Methods of leveling ink on substrates and apparatuses useful in printing are provided. An exemplary embodiment of the methods includes irradiating ink disposed on a first surface of a porous substrate with radiation emitted by at least one flash lamp. The radiation flash heats the ink to at least a viscosity threshold temperature of the ink to allow the ink to flow laterally on the first surface to produce leveling of the ink. The ink is heated sufficiently rapidly that heat transfer from the ink to the substrate is sufficiently small during the leveling that ink at the substrate interface is cooled to a temperature below the viscosity threshold temperature thereby preventing any significant ink permeation into the substrate from the first surface.

21 Claims, 23 Drawing Sheets

METHODS OF LEVELING INK ON SUBSTRATES USING FLASH HEATING AND APPARATUSES USEFUL IN PRINTING

RELATED APPLICATIONS

This application is related to U.S. application Ser. No. 12/764,394, which is filed on the same date as the present application.

BACKGROUND

In printing processes, marking material is applied onto substrates to form images. In some processes, the printed images can exhibit micro-banding and print-through.

It would be desirable to provide methods of leveling ink on substrates and apparatuses useful in printing that can produce high-quality printed images on different types of substrates.

SUMMARY

Methods of leveling ink on substrates and apparatuses useful in printing are provided. An exemplary embodiment of the methods of leveling ink on a substrate comprises irradiating ink disposed on a first surface of a porous substrate with radiation emitted by at least one flash lamp, the radiation flash heating the ink to at least a viscosity threshold temperature of the ink to allow the ink to flow laterally on the first surface to produce leveling of the ink. The ink is heated sufficiently rapidly that heat transfer from the ink to the substrate is sufficiently small during the leveling that ink at the substrate interface is cooled to a temperature below the viscosity threshold temperature thereby preventing any significant ink permeation into the substrate from the first surface.

DRAWINGS

DETAILED DESCRIPTION

Figure 1:
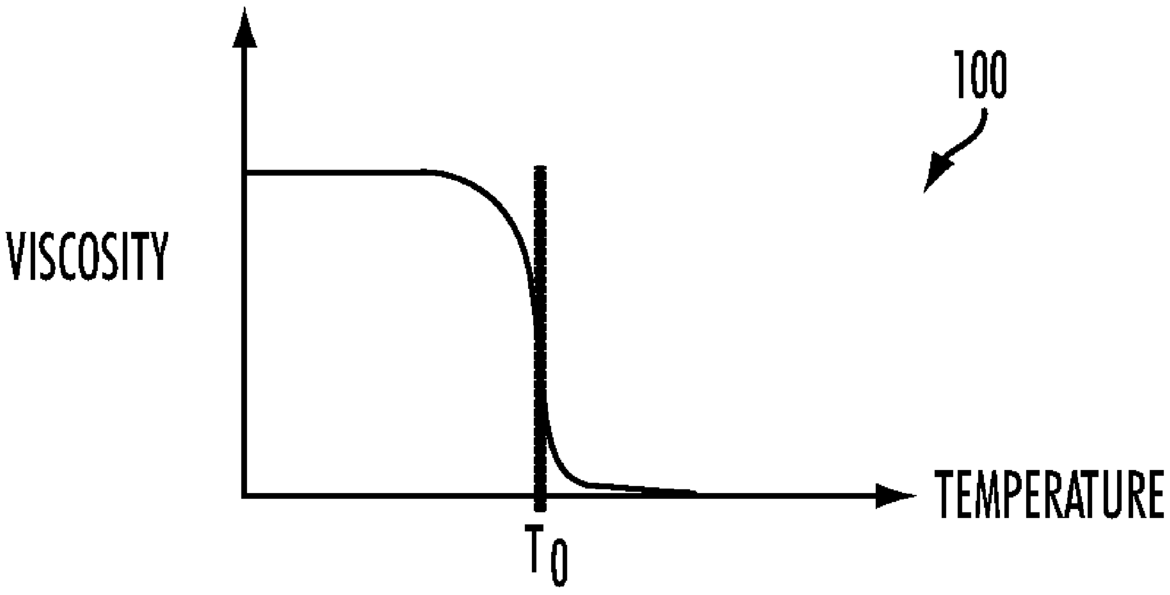
FIG. 1 shows a curve illustrating the viscosity as a function of temperature for a gel ink.

The disclosed embodiments include methods of leveling ink on substrates. An exemplary embodiment of the methods comprises irradiating ink disposed on a first surface of a porous substrate with radiation emitted by at least one flash lamp, the radiation flash heating the ink to at least a viscosity threshold temperature of the ink to allow the ink to flow laterally on the first surface to produce leveling of the ink. The ink is heated sufficiently rapidly that heat transfer from the ink to the substrate is sufficiently small during the leveling that ink at the substrate interface is cooled to a temperature below the viscosity threshold temperature thereby preventing any significant ink permeation into the substrate from the first surface.

Another exemplary embodiment of the methods of leveling ink on substrates comprises irradiating a gel ink disposed on a first surface of a substrate with radiation emitted by at least one flash lamp, the first surface being non-permeable with respect to the gel ink, the radiation flash heating the gel ink to at least a viscosity threshold temperature of the gel ink to allow the gel ink to flow laterally on the first surface to produce leveling of the gel ink.

The disclosed embodiments further include apparatuses useful in printing. An exemplary embodiment of the apparatuses comprises a marking device for applying ink to a first surface of a porous substrate, the ink having a viscosity threshold temperature at which the ink has a viscosity midway between a minimum value and a maximum value of the ink; and a leveling device including at least one flash lamp which emits radiation onto the ink applied to the first surface of the substrate, the radiation flash heating the ink to at least the viscosity threshold temperature to allow the ink to flow laterally on the first surface to produce leveling of the ink. The ink is heated sufficiently rapidly that heat transfer from the ink to the substrate is sufficiently small during the leveling that ink at the substrate interface is cooled to a temperature below the viscosity threshold temperature thereby preventing any significant ink permeation into the substrate.

Ultraviolet light (UV)-curable inks can be used in printing processes to form images on substrates. UV-curable inks are applied to a surface of a substrate and then exposed to ultraviolet light to cure the ink and fix images onto the surface. It has been noted that low-viscosity, UV-curable inks display an unacceptably-high degree of print-through when applied on plain paper substrates which are porous. Print-through is a measure of the amount of ink permeation in the thickness direction of the porous substrates from the surface on which the ink is applied toward the opposite surface. Excessive print-through makes low-viscosity, UV-curable inks unsatisfactory for printing applications with plain paper substrates.

UV-curable gel inks ("UV gel inks") are another type of marking material that can be used to form images on substrates. These inks offer higher viscosities than conventional, low-viscosity, UV-curable inks. UV gel inks are heated to abruptly reduce their viscosity and then applied to substrates. These inks freeze upon contact with the cooler substrates. It has been noted that freezing of UV gel inks upon initial impingement onto substrates, such as paper, and ink drop misdirection can result in micro-banding of images formed on the substrates.

UV-curable inks applied to substrates can be leveled by applying pressure to the inks as disclosed in U.S. patent application Ser. No. 12/256,670 to Roof et al., filed on Oct. 23, 2008 and entitled "Method and Apparatus for Fixing a Radiation-Curable Gel-Ink Image on a Substrate"; U.S. patent application Ser. No. 12/256,684 to Roof et al., filed on Oct. 23, 2008 and entitled "Dual-Web Apparatus for Fixing a Radiation-Curable Gel-Ink Image on a Substrate" and U.S. patent application Ser. No. 12/256,690 to Roof et al., filed on Oct. 23, 2008 and entitled "Apparatus for Fixing a Radiation-Curable Gel-Ink Image on a Substrate, now U.S. Pat. No. 8,002,936," each of which is incorporated herein by reference in its entirety.

UV-curable gel inks have a mayonnaise-like consistency and little cohesive strength when applied on substrates prior to being cured. These inks are formulated to have good affinity to many substrate materials, including porous and non-porous materials. It has been noted that contact methods of flattening a layer of these inks tends to be unsatisfactory because the ink layer can split and leave a substantial portion of the image on the leveling device used to flatten the ink, such as a heated roll.

Due to ink droplet freezing on substrate impingement, Inkjet deposition of UV-curable gel inks results in a corrugated structure of the jetted ink image on substrates. The corrugated ink layer can be leveled by heating the ink to lower its viscosity to allow surface tension forces to reduce the amplitude of the corrugations. It has been noted, however, that this leveling process can result in excessive print-through in porous substrates if too much heating of the substrate in its thickness direction occurs.

In view of these observations regarding difficulties associated with leveling UV gel inks, as well as some other types of inks, methods of leveling ink on substrates and apparatuses useful in printing that can be used to perform the methods are provided. Embodiments of the methods and apparatuses can level suitable ink compositions that thermally quench into a sufficiently-rigid state and have a sufficiently-sharp melting transition at an elevated temperature relative to the substrate temperature.

For example, gel inks can be leveled on substrates in embodiments of the methods and apparatuses. FIG. 1 depicts a curve illustrating the viscosity as a function of temperature for a typical gel ink that has properties compatible with exemplary embodiments of the disclosed methods of leveling ink on substrates. As shown, the viscosity profile for the gel ink has a sharp threshold and the ink transitions from being relatively viscous (having a viscosity of, e.g., on the order or greater than about $10^6$ cP) and unable to flow easily, to being relatively non-viscous (having a viscosity of, e.g., on the order of less than about $10^1$ cP) and able to flow easily over a relatively narrow temperature range. Such gel inks can exhibit a large change in viscosity over a small temperature range of less than about 40 Celsius degrees, less than about 30 Celsius degrees, less than about 20 Celsius degrees, or less than about 10 Celsius degrees, for example. Such gel inks thermally quench into a sufficiently-rigid state and have a sufficiently-sharp melting transition at an elevated temperature relative to the substrate temperature to be compatible with exemplary embodiments of the disclosed methods of leveling inks on substrates.

Exemplary inks having properties as depicted in FIG. 1 and which can be used to form images on substrates in embodiments of the disclosed methods and apparatuses are described in U.S. Patent Application Publication No. 2007/0120919, which discloses a phase change ink comprising a colorant, an initiator, and an ink vehicle; in U.S. Patent Application Publication No. 2007/0123606, which discloses a phase change ink comprising a colorant, an initiator, and a phase change ink carrier; and in U.S. Pat. No. 7,559,639, which discloses a radiation curable ink comprising a curable monomer that is liquid at 25° C., curable wax and colorant that together form a radiation curable ink, each of which is incorporated herein by reference in its entirety.

The curve shown in FIG. 1 exhibits a viscosity threshold temperature $T_0$, which is defined as the temperature at which the viscosity of the ink is midway between its minimum and maximum values. At $T_0$, the viscosity of the ink is sufficiently low such that it can flow easily. $T_0$ can typically range from about 55° C. to about 65° C. for exemplary gel inks. In exemplary embodiments, the ink is heated to at least the viscosity threshold temperature to allow the ink to flow sufficiently under the influence of surface/interfacial tension and interfacial capillary forces on a surface of a substrate to achieve the desired thermal leveling effect.

Embodiments of the methods and apparatuses can level images formed on substrates to mitigate micro-banding of the images without physical contact with the images during the leveling. Embodiments of the methods and apparatuses can level inks on porous substrates with minimal print-through of the inks. The porous substrates have open porosity extending from a front surface on which the inks are deposited toward an opposite back surface (on which inks may also be deposited). The open porosity can extend partially or completely through the thickness dimension of the substrate defined by the front and back surfaces. The pores are permeable to the ink.

The methods and apparatuses can also be used to level inks, such as gel inks, and the like, on substrates other than plain paper, such as coated paper, plastic and metal films and laminates. These substrates can include a surface on which inks are deposited that is non-permeable with respect to the ink. The substrates can be composed of heat-sensitive materials, such as heat-sensitive plastics. Embodiments of the apparatuses can be used in xerography, lithography and flexography.

Embodiments of the apparatuses include at least one flash lamp that emits radiation to heat inks applied on substrates. The emitted radiation produces a short-duration exposure. The radiation exposure supplies sufficient thermal energy to the inks to heat them to a sufficiently-high temperature to reduce their viscosity to enable the inks to level by surface-tension driven lateral reflow on substrate surfaces. This lateral reflow mitigates micro-banding of images formed by the inks.

In embodiments, the radiation emitted from the flash lamp produces heating that is sufficiently high and sufficiently brief to result in only minimal heat transfer from the ink to the substrate. The flash heating time is referred to as $T_{RAD}$. This heat transfer desirably is insufficient to heat the substrate in contact with the ink to a temperature above the ink melting point. The radiation exposure can be effective to minimize print-through of gel inks, and the like, on porous substrates, such as plain paper.

When an ink on a surface of a porous substrate is at a particular temperature, the ink viscosity and surface tensions allow lateral reflow on the surface to reduce surface area of the ink. The amount of time to achieve this lateral reflow of the ink is $t_{L-R}$. Similarly, capillary forces within the pores of the substrate lead to permeation into the substrate. The amount of time for the ink to permeate a given distance in such pores is $t_{PERM}$. Heat absorbed in the ink is transferred by thermal conduction into the cooler substrate, heating the near-surface region of the substrate most and being conducted eventually to the opposite face of the substrate. There is a characteristic time, $t_{DIFF}$, for such thermal diffusion to occur in substrates. The value of $t_{DIFF}$ depends on factors including the heat capacity and thermal diffusivity of the substrate, as well as temperature gradients.

In embodiments of the leveling process, the following relationships between these time values are desirable: $t_{RAD}$ is comparable with, and shorter than $t_{L-R}$ and $t_{PERM}$; $t_{PERM}$ is longer than $t_{L-R}$; and $t_{L-R}$ is much shorter than $t_{DIFF}$. These relationships can be written as follows: $t_{RAD} \leqq t_{L-R} < t_{PERM} << t_{DIFF}$. When $t_{DIFF}$ is sufficiently long, even if $t_{PERM}$ is short, the thermal gradient in the substrate will be sufficiently high and the ink will be quenched near the top surface of the substrate and mainly reflow laterally along that surface.

Figure 2:
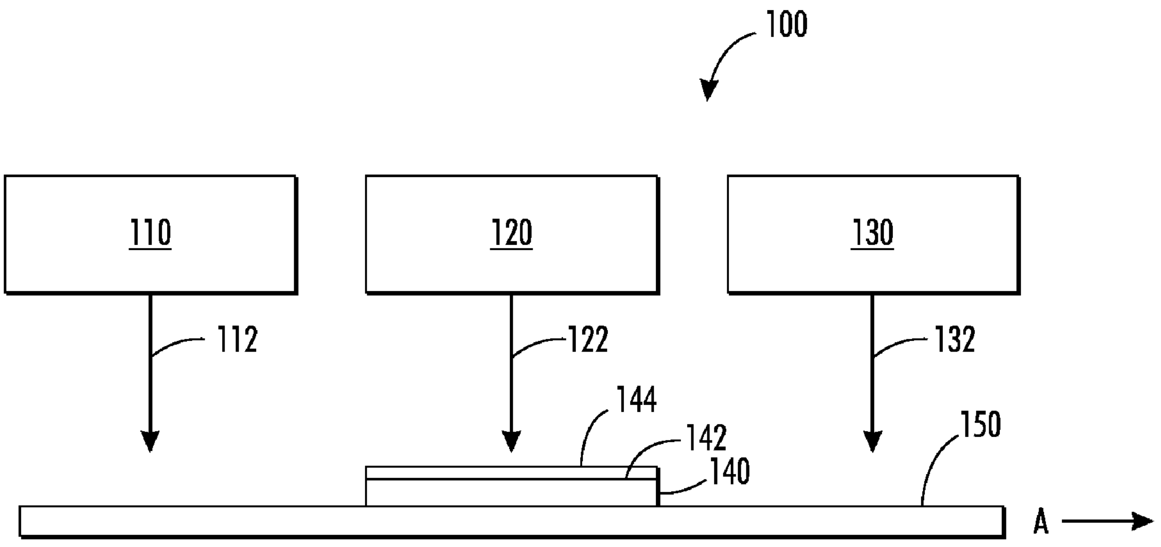
FIG. 2 depicts an exemplary embodiment of an apparatus useful in printing.

FIG. 2 depicts an exemplary embodiment of an apparatus 100 useful in printing. The apparatus 100 includes a marking device 110 for depositing ink 112 onto substrates, and a leveling device 120 for irradiating the as-deposited ink with radiation 122 of a selected spectrum to level the ink. The illustrated apparatus 100 also includes an optional UV curing device 130 for radiating as-leveled, UV-curable inks with UV radiation 132 to cross-link the inks and provide robustness, when such inks are optionally used to form images on substrates.

FIG. 2 shows a substrate 140 supported on a platen 150. The platen 150 can be stationary. In other embodiments, the platen 150 can be movable along the process direction A with respect to the leveling device 120. In other embodiments, a separate printing platen (not shown) can be provided at the marking device 110, a separate platen (not shown) can be provided at the leveling device 120, and a separate platen (not shown) can be provided at the curing device 130. The platen(s) in the apparatus 100 can be plates, for example. Other types of devices, such as rollers, can also be used to transport the substrate 140. An as-applied layer of ink 144 is shown on the top surface 142 of the substrate 140. The platen 150 can be moved to transport the substrate 140 in the process direction, A, past the marking device 110, leveling device 120 and the optional curing device 130 to produce images on the substrate 140. The leveling device 120 can typically be spaced from the marking device 110 by a distance of about 10 cm to about 50 cm along the process direction A.

The marking device 110 can include one or more print heads (not shown). For example, the print heads can be heated piezo print heads. Typically, the marking device 110 includes a series of print heads typically arranged in multiple, staggered rows in the marking device 110. The print heads can be constructed of stainless steel, or the like. The print heads can provide a modular, scalable array for making prints using different sizes of substrates. The print heads can use cyan, magenta, yellow and black inks, to allow inks of different colors to be printed atop each other.

The print heads can heat the ink to a sufficiently-high temperature to reduce the ink viscosity to a desired viscosity for jetting from the nozzles. The hot ink is jetted as droplets from the nozzles of the print heads onto stationary or moving substrates at the marking device 110.

Gel inks, such as UV gel inks, can be used in the print heads of the marking device 110. In other embodiments, other types of inks having suitable properties, such as wax inks, and the like, can be used in the marking device 110 to form images. The inks can exhibit a large change in viscosity over a small change in temperature during cooling or heating. For example, gel inks can be heated to a temperature above the viscosity threshold temperature within the print heads. UV gel inks can typically be heated to a temperature of at least about 80° C. in the print heads to develop the desired viscosity for jetting. UV gel inks can typically exhibit a large increase in viscosity when cooled from the jetting temperature by about 10° C., e.g., from about 80° C. to about 70° C. When the ink impinges on a substrate, such as plain paper, heat is transferred from the ink to the cooler substrate. The as-deposited ink rapidly cools and develops a gel consistency on the substrate. Due to the rapid cooling, the ink does not have sufficient time to reflow laterally, or level, on the substrate. Consequently, images formed on the substrates with the inks can display micro-banding.

The leveling device 120 includes at least one flash lamp that emits radiation 122 to irradiate the ink 144. In general, a typical flash lamp irradiates only a narrow zone of about 25 mm (length $X_1$ shown in FIG. 9) on a substrate at a distance of about 25 mm (length d in FIG. 9) from the flash lamp housing. The throughput of the substrate through the leveling process depends on the length of the zone irradiated with sufficient optical energy per pulse to effectively level the ink, and the pulsing rate of the flash lamp. The throughput can be increased by increasing the number of flash lamps and/or the rate at which they are pulsed. Typically, a group of four or more flash lamps can be used with a common extended reflector to uniformly illuminate a longer leveling zone and thereby increase the throughput capability of the leveling device. The radiation can have an emission spectrum falling within the visible-infrared portion of the electromagnetic spectrum. In embodiments, the radiant energy source can be, e.g., a broadband, IR-VIS (infrared-visible radiation) radiant energy source with an emission spectrum that covers the visible range (~400 nm to 700 nm) and extends into the infrared range (>700 nm).

The flash lamps used in the leveling device can achieve an exposure zone focal width ranging from about 25 mm to about 200 mm, for example.

In embodiments, the flash lamp and the substrate can both be stationary. In other embodiments, the substrate can be moved relative to the flash lamp during irradiation of the substrate. In principle, at a given transport speed of the substrate relative to the leveling device, reducing the focal width of the flash lamp reduces the exposure time of ink on the substrate. However, typically the exposure time of the flash lamp is about 1 ms. Accordingly, for a 1 m/s substrate speed, the substrate will move only about 1 mm during the flash within an exposure zone of about 100 mm to about 200 mm.

The platen 150 supporting the substrate 140 can be temperature controlled to transfer heat away from the bottom surface of the substrate 140 during irradiation of the ink at the leveling device 120 to control the ink and substrate temperatures during the leveling process, to minimize print-through. The surface of the platen 150 in contact with the substrate 140 can be maintained at a temperature of about 2° C. to about 22° C., for example. The leveling temperature is selected to achieve acceptable print-through while also minimizing the amount of environmental control needed to prevent water condensation on the leveling platen 150.

In other embodiments, the platen supporting the substrate may not be temperature controlled when sufficient lateral reflow of ink on the substrate can be achieved without concern that any portion of the substrate may reach a sufficiently-high temperature during radiation of the ink to result in more than a minimal amount of vertical transport of the ink in porous substrates. In embodiments, some amount of vertical transport of the ink is desired to provide sufficient fixing of ink to porous substrates. In non-porous substrates, such as non-porous plastics and metals, chemical bonding of the ink to the substrate surface, and micro-porosity at the substrate surface, can provide sufficient fixing of the ink to the surface.

In the apparatus 100 shown in FIG. 2, the flash lamp of the leveling device 120 irradiates the ink 144 on the substrate 140. The flash lamp can emit radiation with a pulse of less than about 10 ms, such as less than about 5 ms, less than about 4 ms, less than about 3 ms, less than about 2 ms, or less than about 1 ms. A single flash lamp can emit radiation covering a distance in the process direction A with sufficient total leveling energy of about 25 mm to about 50 mm, depending on the particular flash lamp and reflector device used.

In embodiments in which the substrate is moved by the platen 150 during leveling, the substrate 140 can typically be moved at a speed up to about 1 m/s to about 2 m/s relative to the flash lamp. The ink 144 on the moving substrate 140 is irradiated for only a short amount of time by the flash lamp. In principle, increasing the transport speed of the substrate reduces the exposure time of the ink 144 on the substrate 140. However, typically the exposure time of the flash lamp is about 1 ms and about four to eight flash lamps can typically be used within a common extended reflector. Accordingly, for a 1 m/s substrate speed, the substrate will move only about 1 mm during the flash within an exposure zone of about 100 mm to about 200 mm.

Figure 9:
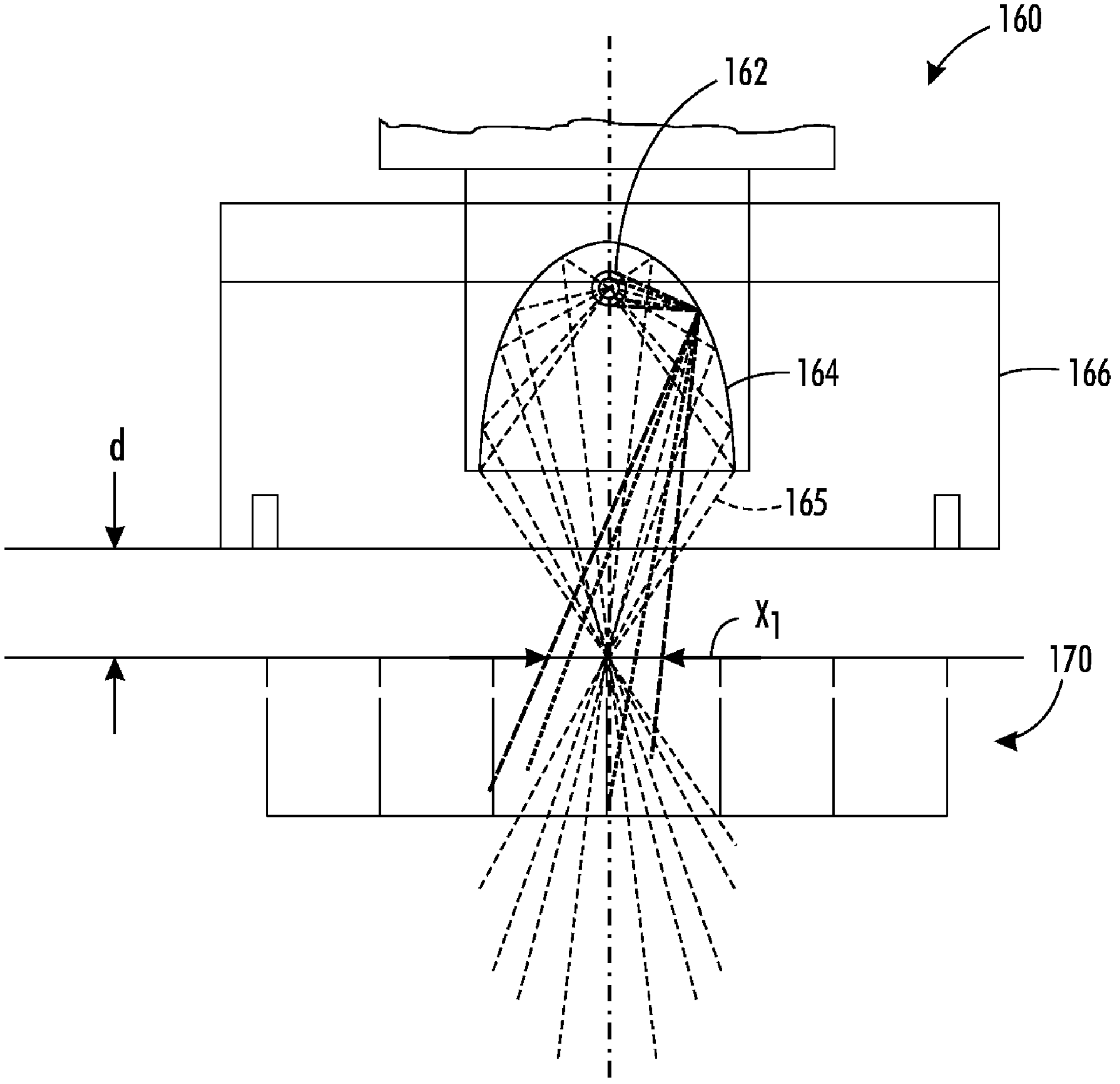
FIG. 9 depicts an exemplary embodiment of a flash lamp device.

FIG. 9 shows an exemplary embodiment of a single flash lamp device 160 that can be used in the leveling device 120. The flash lamp device 160 includes a flash lamp 162, a reflector 164 positioned to reflect radiation 165 emitted by the flash lamp 162, and a housing 166. A substrate 170 is shown positioned below the flash lamp device 160. A flash lamp is a type of lamp that is activated for only a short amount of time each time that it emits radiation. An exemplary type of flash lamp that can be for used for leveling ink on substrates is a xenon flash lamp. A xenon flash lamp is an electric glow discharge lamp that produces extremely intense, incoherent, full-spectrum white light for very short durations. The lamp comprises a sealed tube, e.g., fused quartz, which is filled with a mixture of gases, primarily xenon, and electrodes to carry electrical current to the gas mixture. A high-voltage power source is used to energize the gas mixture. This high voltage is usually stored on a capacitor to allow very fast delivery of very high electrical current when the lamp is triggered. An exemplary suitable flash lamp that can be used is the model RC802-LH840 Interweave flash lamp available from Xenon Corporation of Wilmington, Mass. This flash lamp is linear; has a length of 16 inches; can be run at 3 pulses per second, for example; and can deliver a nominal energy density of about 1.25 J/cm$^2$ per pulse onto substrates at a distance, d, of about 1 inch from the flash lamp housing. Other flash lamps that can deliver an energy density per flash of about 1 to about 4 J/cm$^2$ can also be used. In embodiments, the energy input to the ink can be about 0.1 J/cm$^2$ to about 3 J/cm$^2$, or about 10% to about 75% absorption of the incoming flash energy. Also in embodiments, four or more flash lamps with a common extended reflector are typically used to irradiate an extended zone to enable higher throughput through the leveling device.

The illustrated reflector 164 is an elliptical reflector. Ray tracing for the reflector is shown in FIG. 9. As shown, the elliptical reflector 164 and linear flash lamp 162 can provide a concentrated exposure over an exposure zone $X_1$ of about 1 inch along the process direction.

In the apparatus 100, the radiation emitted by the flash lamp onto the ink 144 is effective to heat the ink and lower the ink viscosity sufficiently to allow lateral reflow, or thermal reflow leveling, of the ink on the top surface 142 of the substrate 140. The ink can be partially melted or fully melted by the radiant energy, with full melting producing greater reflow coverage and more desirable leveling. The ink can be heated sufficiently rapidly by the flash heater that heat transfer from the ink to the substrate 140 is sufficiently small during the leveling that ink at the substrate interface is cooled to a temperature below the viscosity threshold temperature thereby preventing any significant ink permeation into the substrate 140. The "substrate interface" is defined as where the ink contacts the substrate, which may be at the top surface 142, or below the top surface 142. Penetration of the ink 144 into the substrate 140 resulting from heating can be limited to a maximum depth of, e.g., less than about 20 μm, less than about 10 μm, less than about 5 μm, less than about 4 μm, less than about 3 μm, or less than about 2 μm. Consequently, print-through of porous substrates, such as plain paper, by vertical ink flow can be substantially eliminated. The lateral reflow of the ink 144 improves optical density by mitigating micro-banding of the ink 144 on the substrate 140.

Different inks that can be used in embodiments of the methods and apparatuses can have different viscosities and surface tensions at the leveling target temperature. Leveling process parameters including leveling time and irradiation power and emission spectrum of the flash heater can be selected to be compatible with the properties of the inks used in the methods and apparatuses, to produce desirable reflow and leveling of the inks driven by surface tension and capillary forces.

Figure 3:
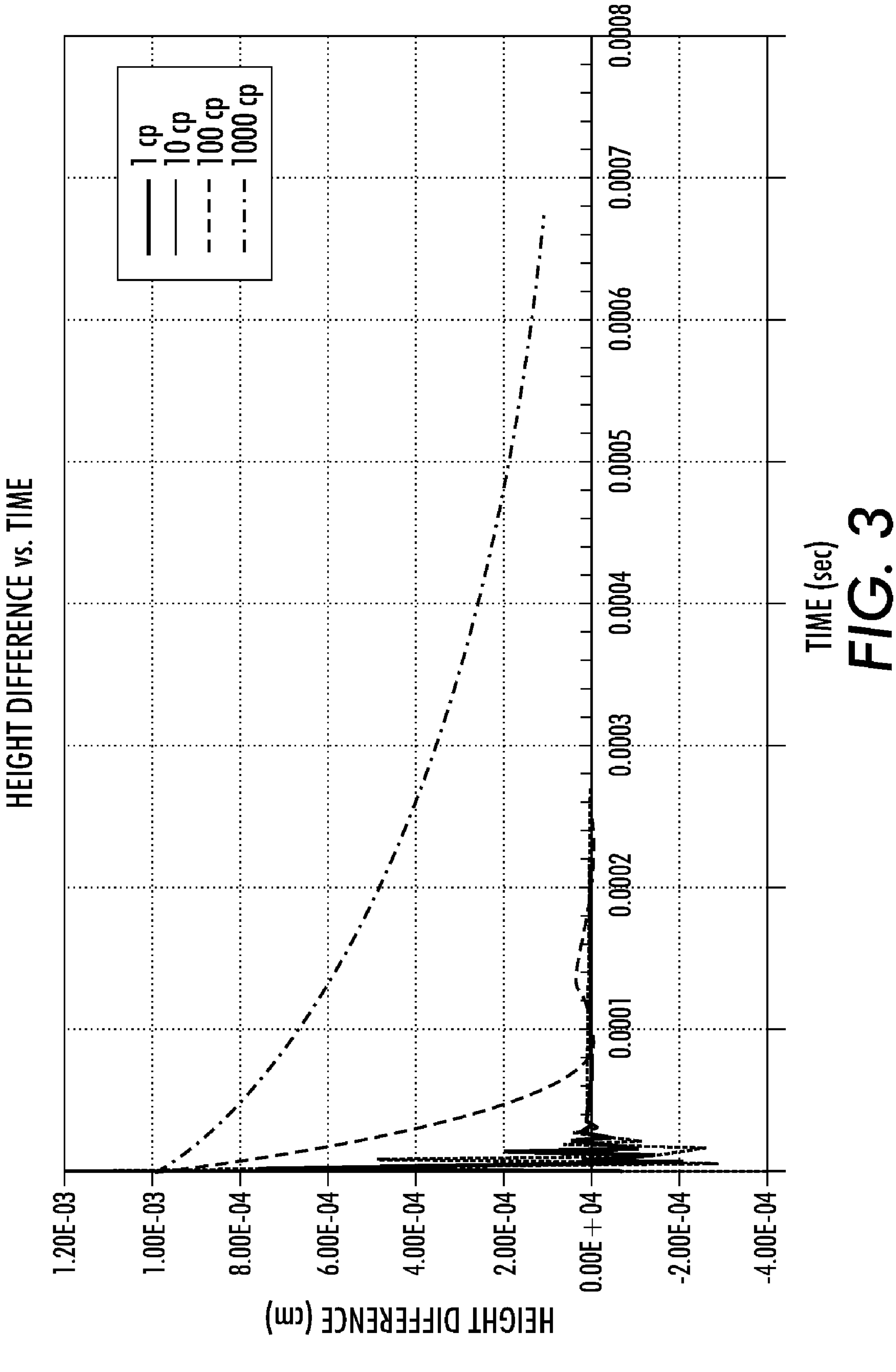
FIG. 3 shows modeled relationships for the height differences of ink images having a corrugated structure as a function of time during an ink leveling process among inks having different viscosities.

FIG. 3 shows modeled relationships between the height differences of ink images having a corrugated structure as a function of time during an ink leveling process. The model uses ink viscosities of 1 cp, 10 cp, 100 cp and 1000 cp during leveling; a corrugation length dimension of 20 μm, a starting height difference of 10 μm, and an ink surface tension of 30 dynes/cm. As shown, as the ink viscosity decreases, the amount of time needed to achieve a given reduction in height difference decreases. These results indicate that the time scale for the leveling process depends on both the surface tension and the viscosity of the ink, as well as the length scale of the corrugations. For a viscous liquid driven by surface tension forces, the time dependence can be characterized by a non-dimensional time, $t_{ND}$, where: $t_{ND}$=(surface tension×time)/(viscosity×length). A non-dimensional time of about 0.1 is desirable for leveling. These results indicate that a 0.1 ms time duration of the radiation onto the ink is sufficient to level 100 cp, 20 μm corrugations, or 10 cp, 200 μm corrugations for liquids with a surface tension of 30 dynes/cm.

Figure 4:
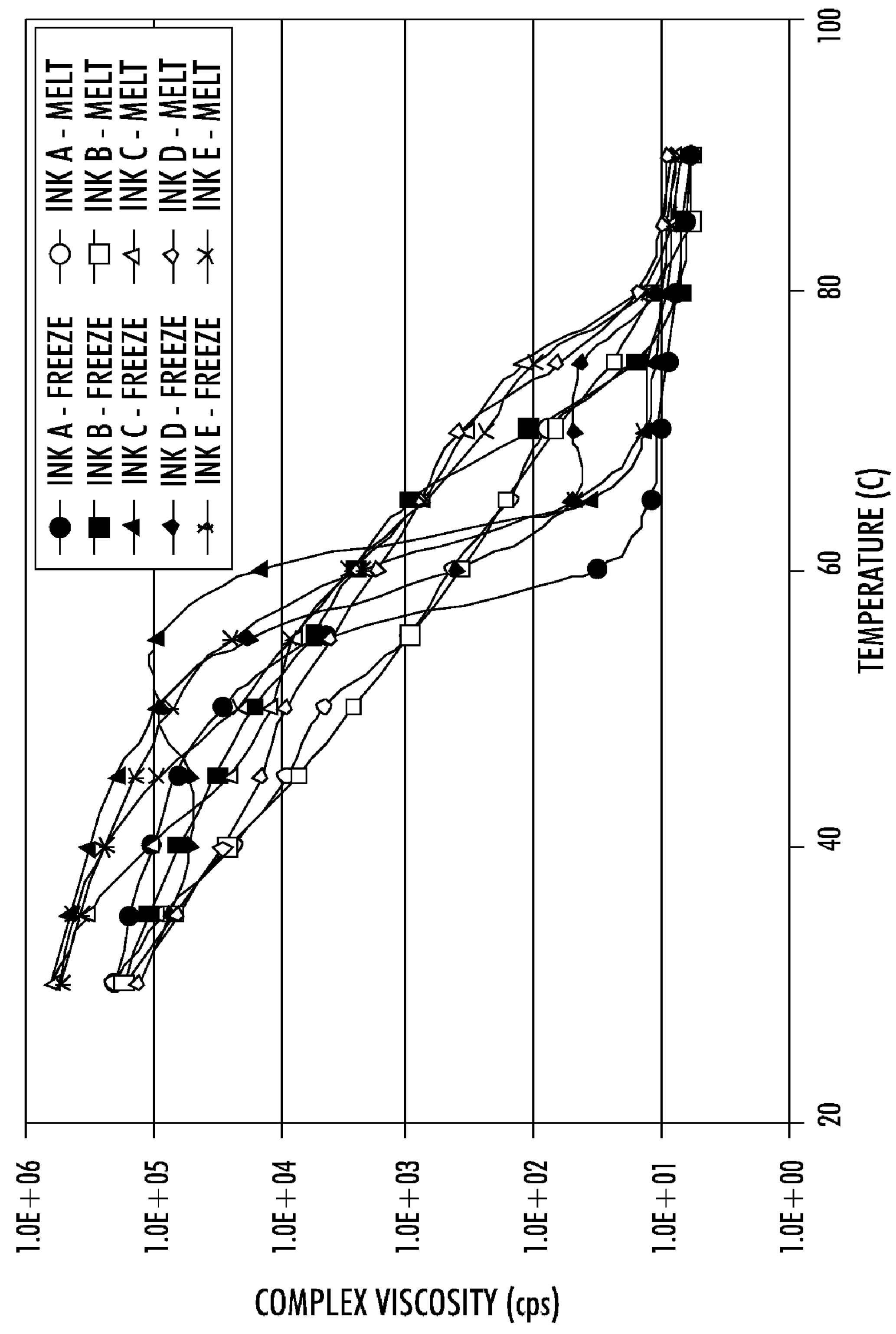
FIG. 4 shows the relationship between complex viscosity and temperature for different UV-Gel ink formulations during the melting and freezing processes of the inks.

FIG. 4 shows the relationship between complex viscosity and temperature for different UV-Gel ink formulations during the melting and freezing processes of the inks. These curves were measured directly on a commercial rheometer. Inks A to E have the following compositions by weight: ink A: low gel (5%)-low wax (2%); ink B: low gel (5%)-high wax (10%); ink C: high gel (10%)-low wax (2%); ink D: high gel (10%)-high wax (10%); and ink E: 7.5% gel-5% wax. The results in FIG. 4 show that when using the melting process to characterize leveling, the viscosity varies from about $10^5$ cp at 30° C. to about 10 cp at 80° C.

Figure 5:
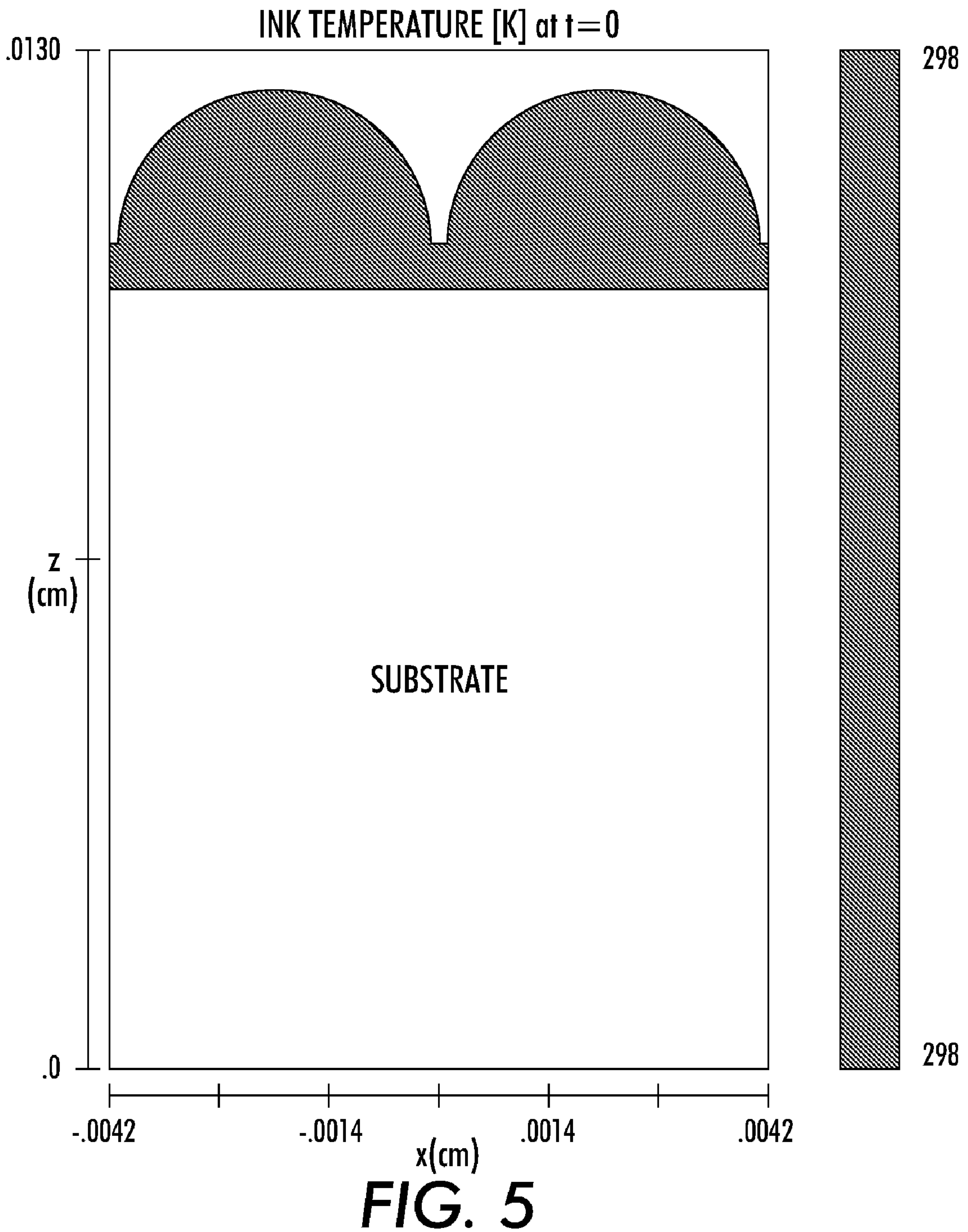
FIGS. 5 and 6 show modeled results for heating of an ink layer of a UV gel ink on a substrate using a 1 ms pulse of energy, with FIG. 5 showing the ink shape and temperature before heating, and FIG. 6 showing the ink shape and temperature at a time of 1 ms resulting from heating.
Figure 6:
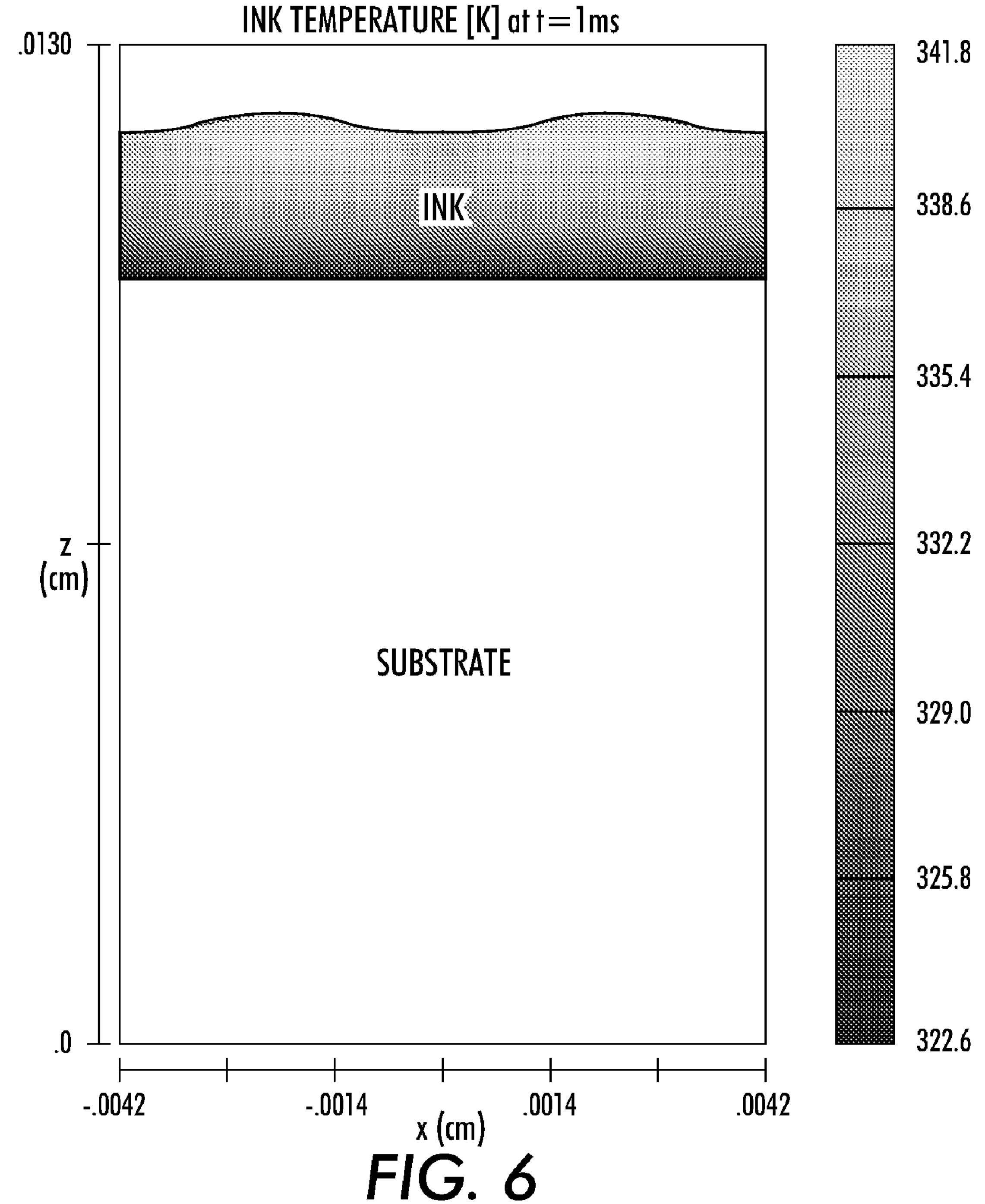

FIGS. 5 and 6 show modeled results for heating of an ink layer of a UV gel ink on a substrate using a short duration, 1 ms pulse of energy. The pulse can be produced by a flash lamp. FIG. 5 shows the ink shape and temperature before heating, and FIG. 6 shows the ink shape and temperature at a time of 1 ms resulting from heating. In the model, the energy input to the ink layer is 0.12 Joules/cm$^2$ (about 12% absorption of the incoming flash energy). In FIGS. 5 and 6, the x-axis (width dimension) and z-axis (depth direction) have units of centimeters, and the temperature is in Kelvin. The spacing between the peaks of the rows of gelled UV-gel ink is 42 μm (the spacing for 600 dpi printing). The starting height of the rows of gelled ink is 20 μm on a continuous ink layer of 5 μm on the substrate. The ink height corresponds to about two layers of as-printed ink (e.g., a secondary color, such as blue composed of layers of cyan ink+magenta ink). As shown in FIG. 6, the short-duration heating of the ink layer levels the ink. The ink reaches a maximum temperature in the region of the peaks.

Figure 7:
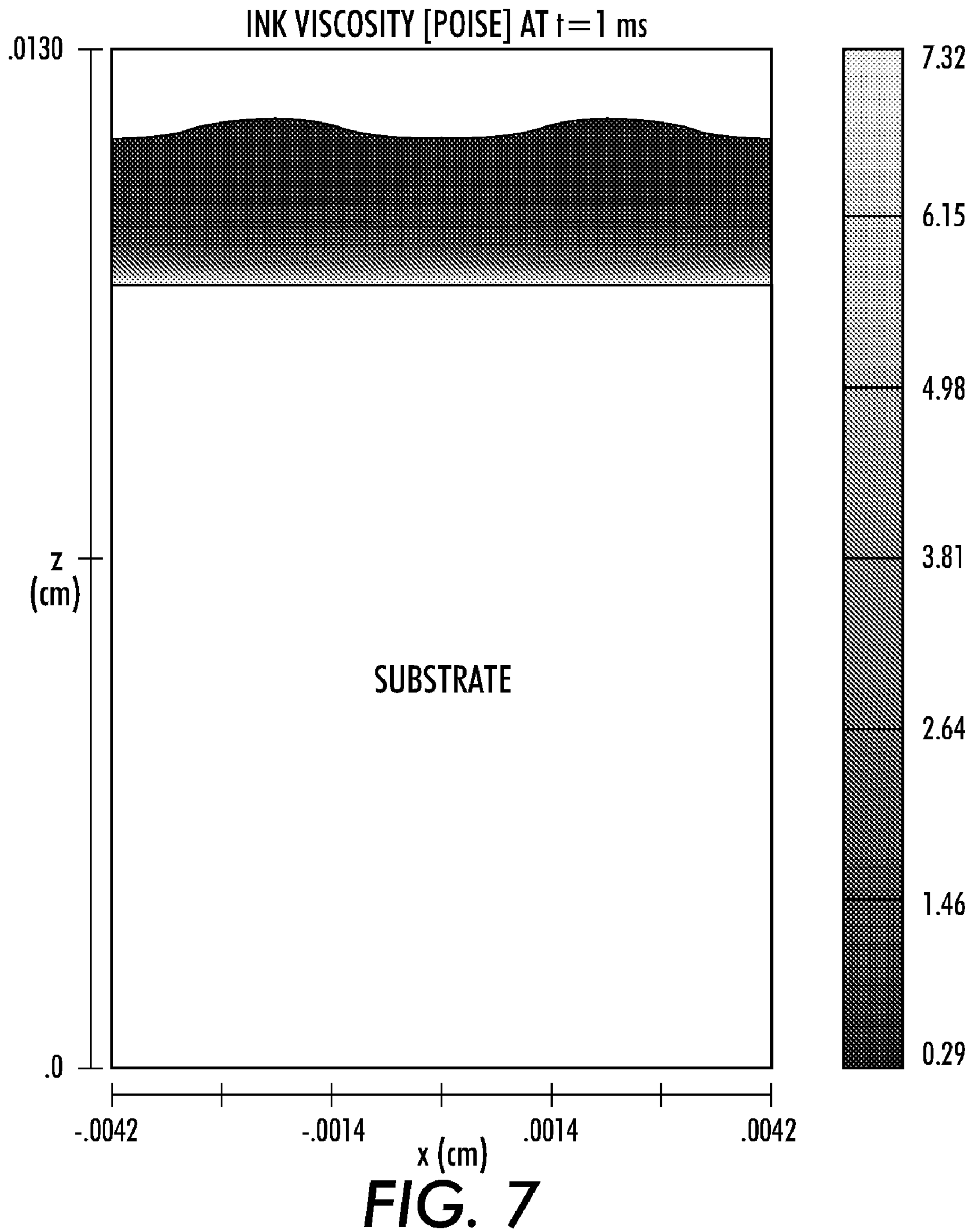
FIG. 7 shows modeled results of the ink viscosity as a function of position at a time of 1 ms resulting from heating of an ink layer with the pulse of energy from a flash lamp.

FIG. 7 shows the ink viscosity as a function of position at a time of 1 ms resulting from heating of the ink layer with the pulse of energy from the flash lamp. As shown, the ink viscosity is at a minimum value in the regions of the peaks.

Figure 8:
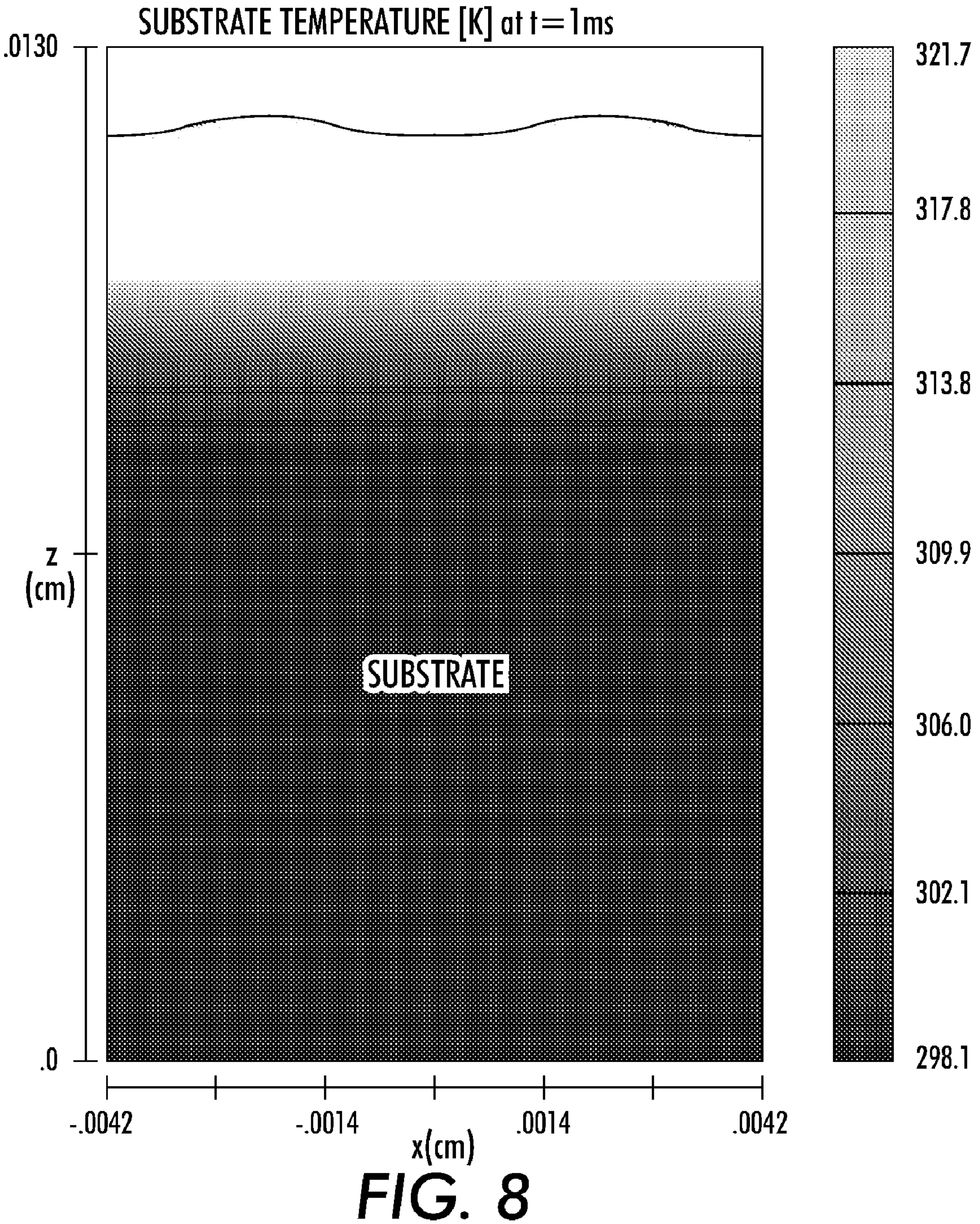
FIG. 8 shows modeled results of the substrate temperature in the thickness direction as a function of position at a time of 1 ms resulting from the heating of the ink layer.

FIG. 8 shows the substrate temperature in the thickness direction as a function of position at a time of 1 ms resulting from the heating of the ink layer. As shown, the substrate is not heated appreciably by the heating of the ink layer. The warmest point in a very thin layer of about 1 μm thickness at the top of the paper is only about 48° C., at which the ink viscosity is significantly above $10^3$ cP.

Figure 10:
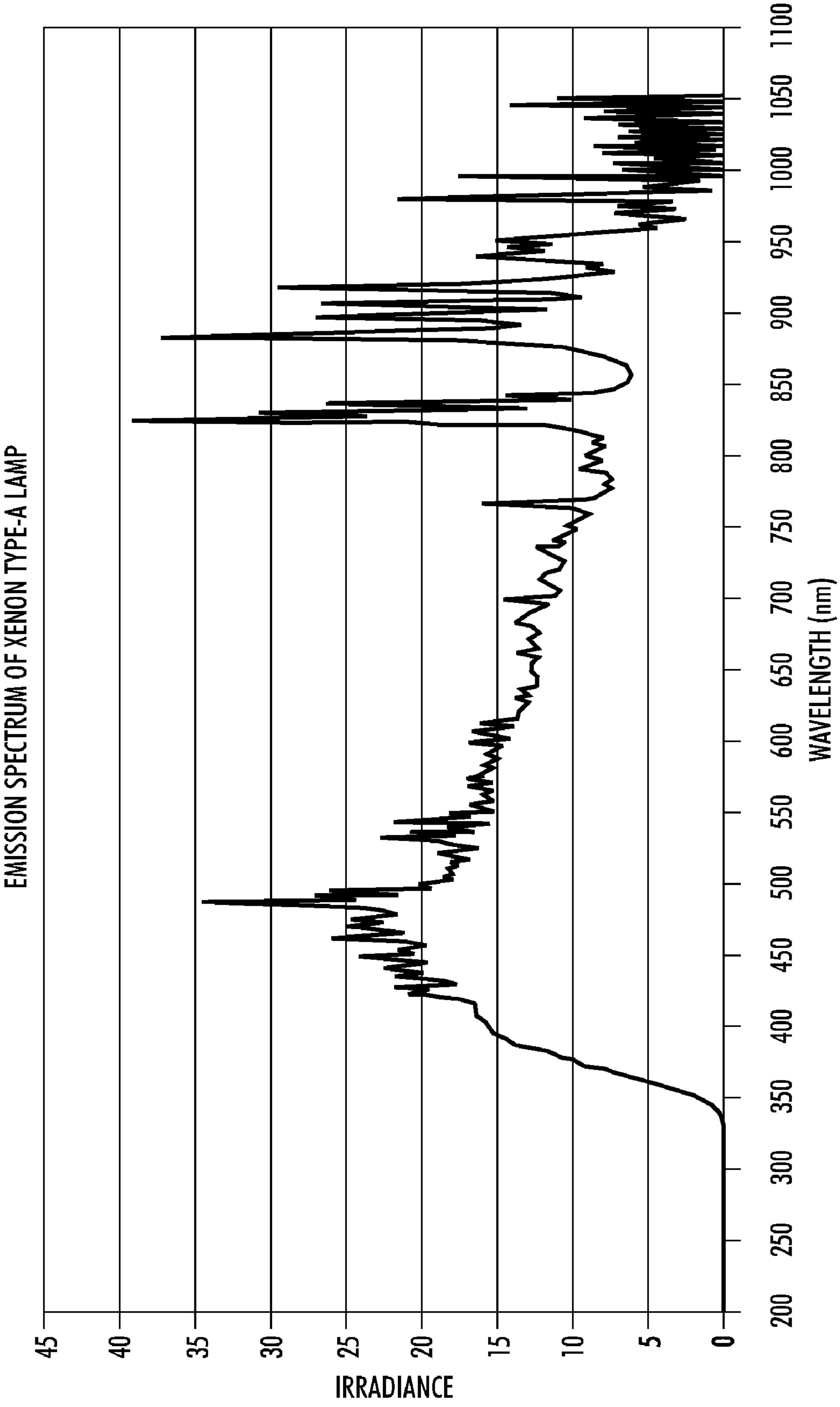
FIG. 10 shows the emission spectrum of a Type-A Xenon flash lamp with a cerium-doped glass tube.

FIG. 10 shows the emission spectrum of a Type-A Xenon flash lamp with a cerium-doped glass tube. The glass tube filters out UVB (290-320 nm) and UVC (200-290 nm) radiation, so that the lamp emits only UVA (320-400 nm) radiation.

UV gel inks can contain photo-initiators that have sensitivity to UVA radiation. It is desirable to filter out any portion of the UVA radiation spectrum of a flash lamp that can cause polymerization of UV gel inks. Such polymerization can prevent the desired leveling produced by thermal reflow energy produced by the flash lamp. FIG. 10 shows that a large amount of the UVA is removed in the range of 320 nm to 350 nm by the cerium glass in the Type-A Xenon flash lamp. A significant portion of the emission spectrum remains in the range of 350 nm to 400 nm.

Figure 11:
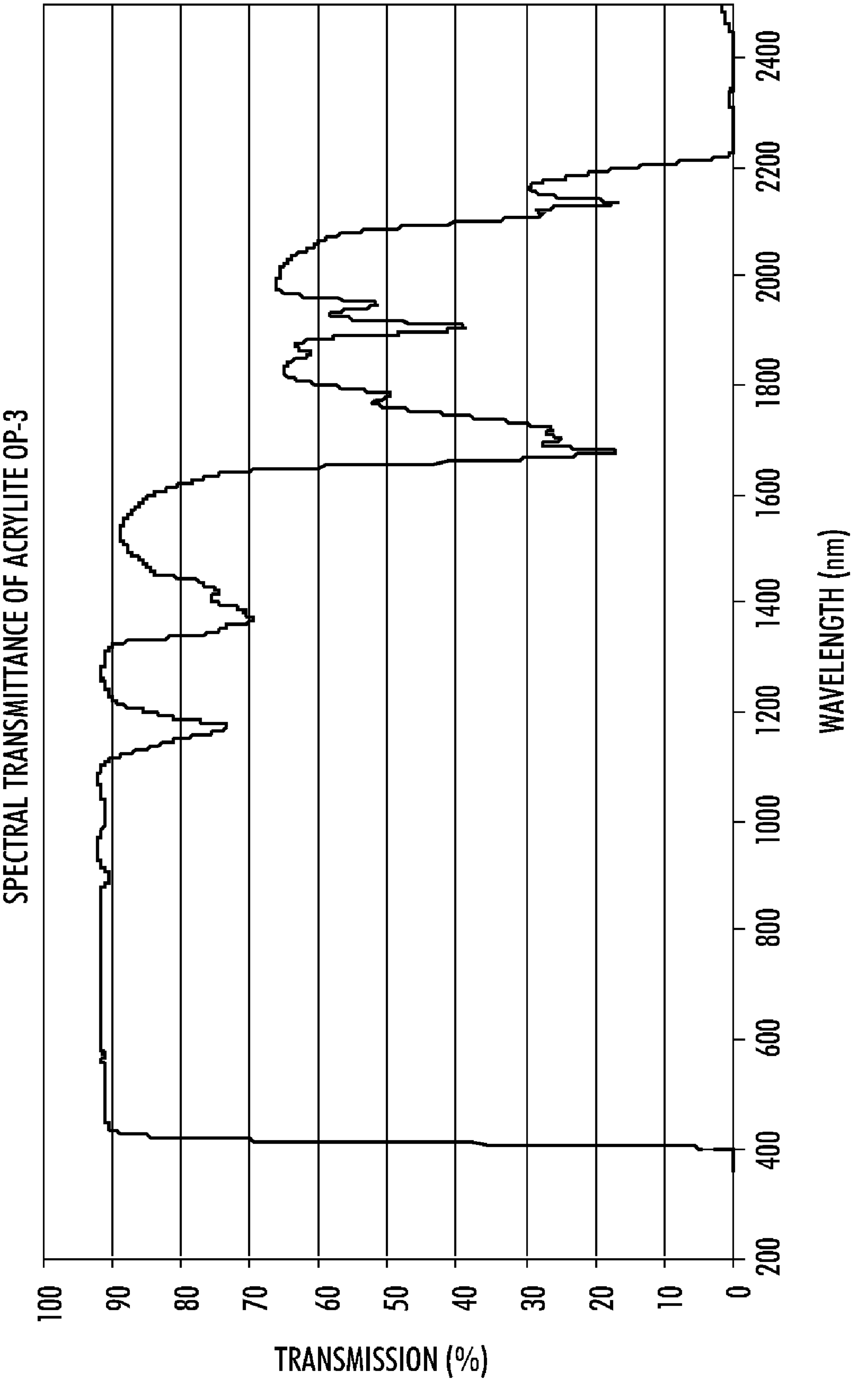
FIG. 11 shows the transmission spectrum of an acrylite OP-3 filter.

FIG. 11 shows the transmission spectrum of an acrylite OP-3 filter. As shown, this filter removes radiation having a wavelength of less than 400 nm.

Figure 12:
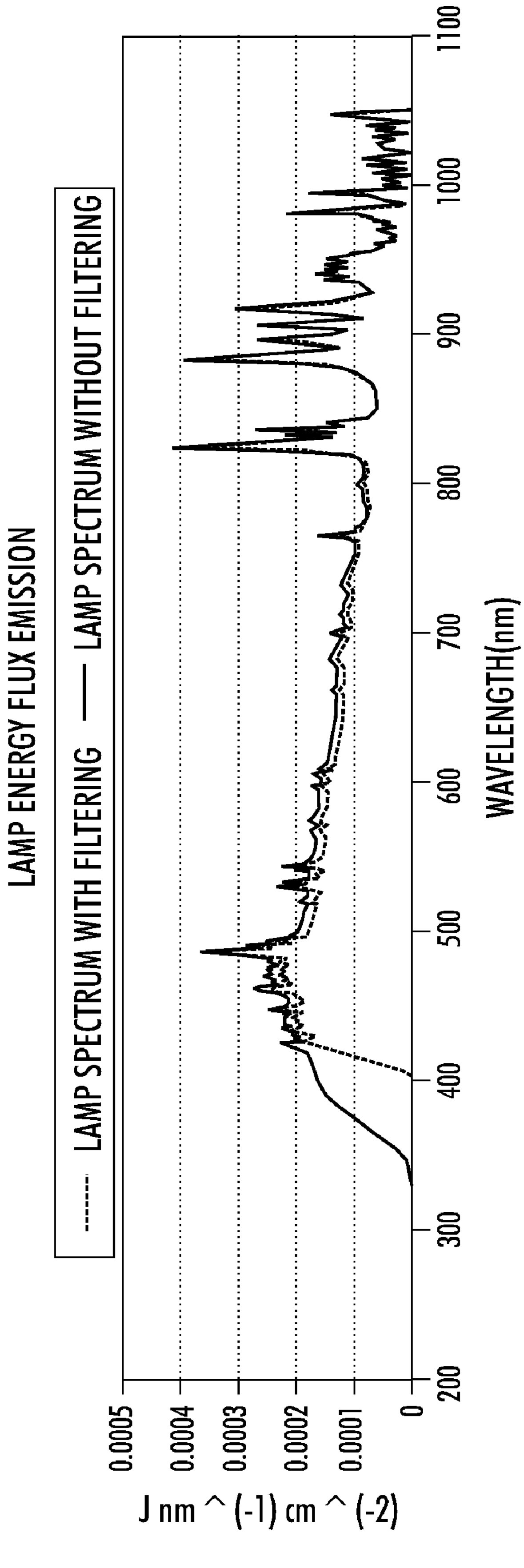
FIG. 12 shows the emission spectrum of a Type-A Xenon flash lamp with a cerium-doped glass tube without filtering and the spectral irradiance of the flash lamp after being filtered with an acrylite OP-3 filter.

FIG. 12 shows the emission spectrum of a Type-A Xenon flash lamp with a cerium-doped glass tube without filtering and the spectral irradiance of this flash lamp after being filtered with an acrylite OP-3 filter. As shown, the filter removes the emitted radiation of the lamp flash having a wavelength of less than 400 nm. Filtering out a portion of the emission spectrum of the Type-A Xenon flash lamp can improve the leveling performance of this flash lamp for different ink colors, including cyan, magenta and blue (magenta on top of cyan). This improvement can be significant for blue ink.

Figure 13:
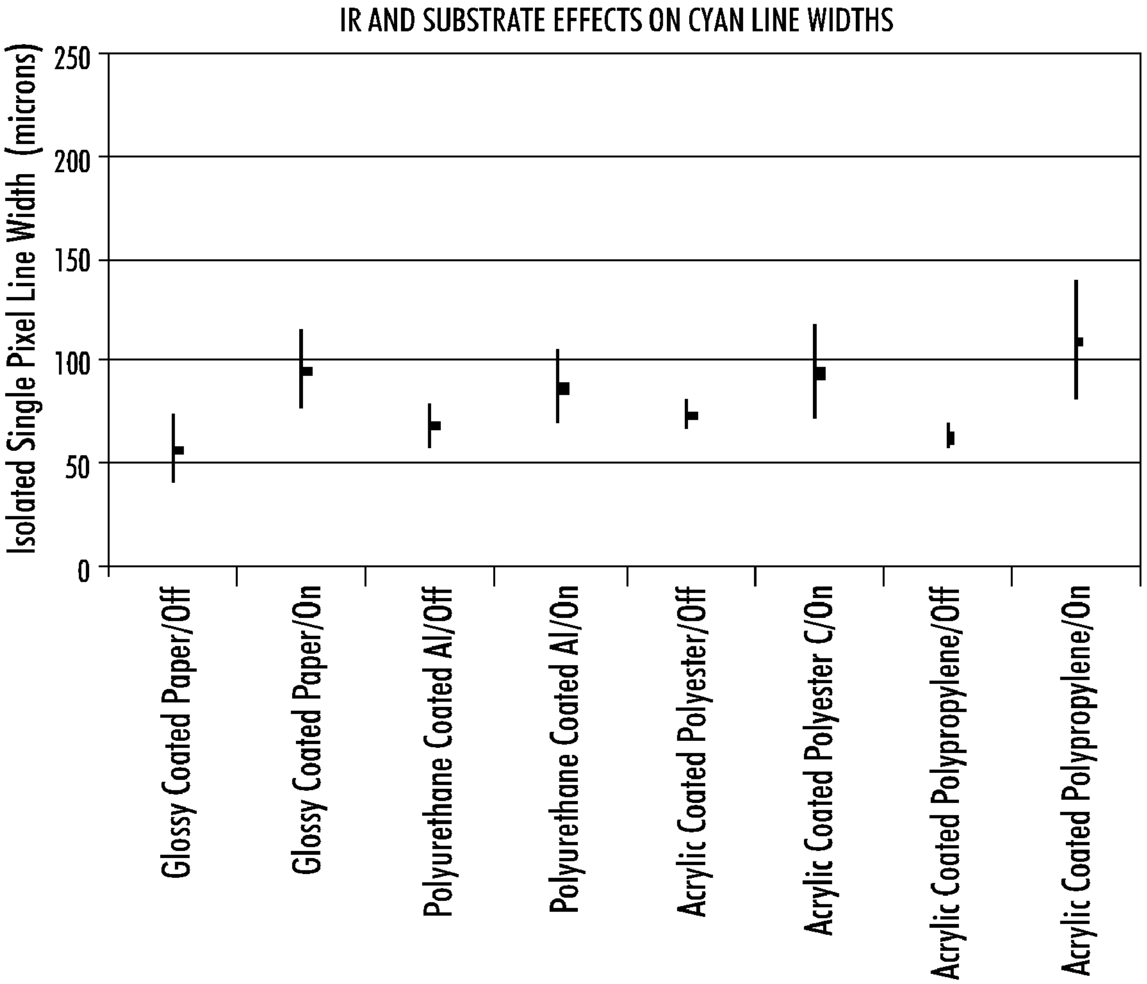
FIGS. 13 and 14 show line width growth for cyan (FIG. 13) and black (FIG. 14) UV gel ink single pixel lines at 600 dpi on different substrate materials resulting from flash leveling with a Type-B Xenon flash lamp.
Figure 14:
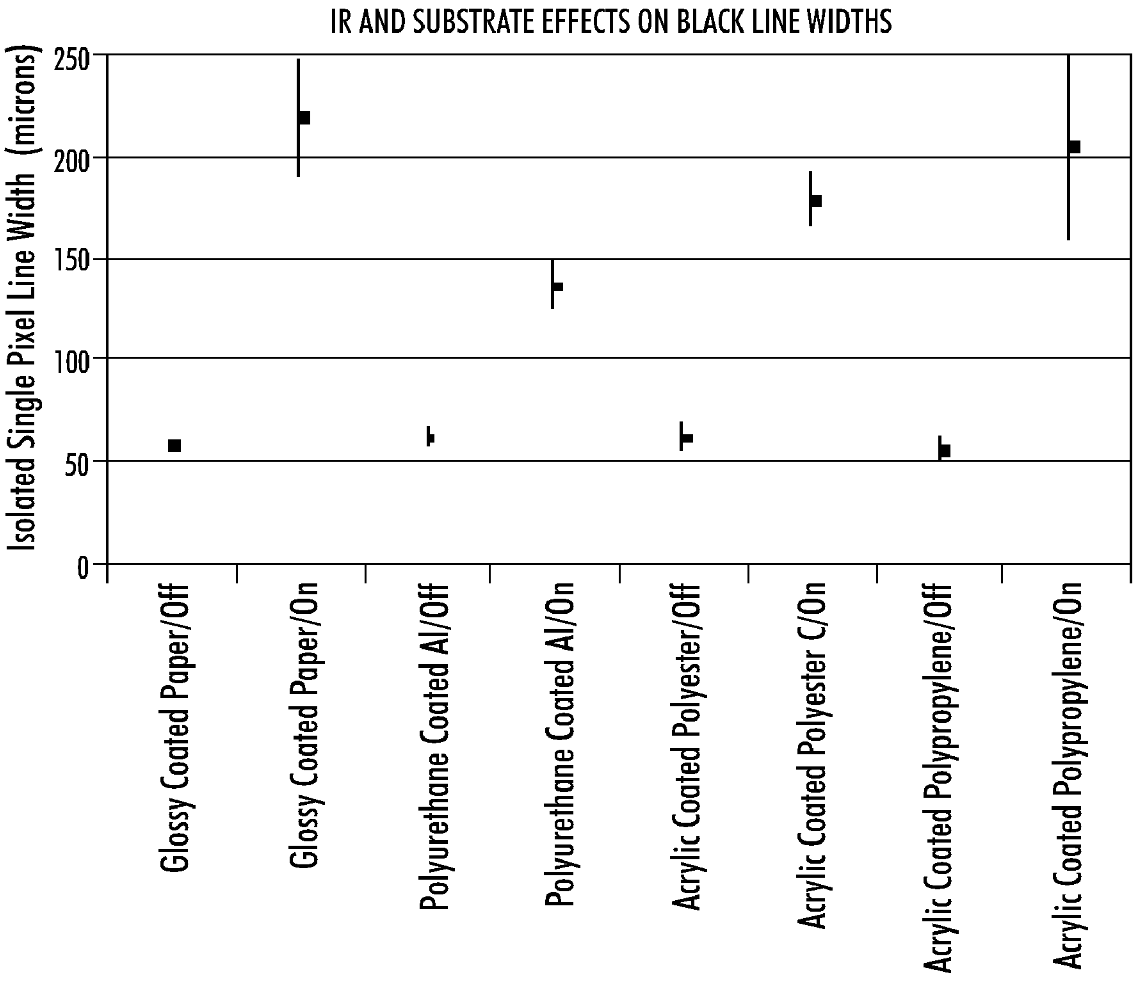

Line width growth can be used as a measure of the amount of ink spreading on a substrate surface that results from flash leveling of the ink. FIGS. 13 and 14 show line width growth for cyan (FIG. 13) and black (FIG. 14) UV gel ink single pixel lines at 600 dpi on different substrate materials. The line width measurements with their total range are shown on different substrates for the flash lamp leveling OFF compared with the flash lamp leveling ON. The substrate materials include glossy coated paper, polyurethane-coated Al, acrylic coated polyester and acrylic coated polypropylene. In FIGS. 13 and 14, "OFF" means without flash leveling, and "ON" means with flash leveling. A linear Type-B Xenon lamp with a Germicil-type quartz tube (passing down to 254 nm UV, which disrupts DNA base pairing) operated at 3 Hz and 3 ips throughput was used to irradiate the ink. The emission spectrum of the Type-B Xenon lamp in the 400 nm to 1100 nm region is essentially identical to that of the Type-A lamp in FIG. 12, but the Type-B lamp also contains UVA (320 nm to 400 nm), UVB (290 nm to 320 nm) and UVC (200 nm to 290 nm) radiation. The results shown in FIGS. 13 and 14 demonstrate that, in general, the Type-B Xenon flash lamp produces larger line width growth for black lines than for cyan.

Figure 15:
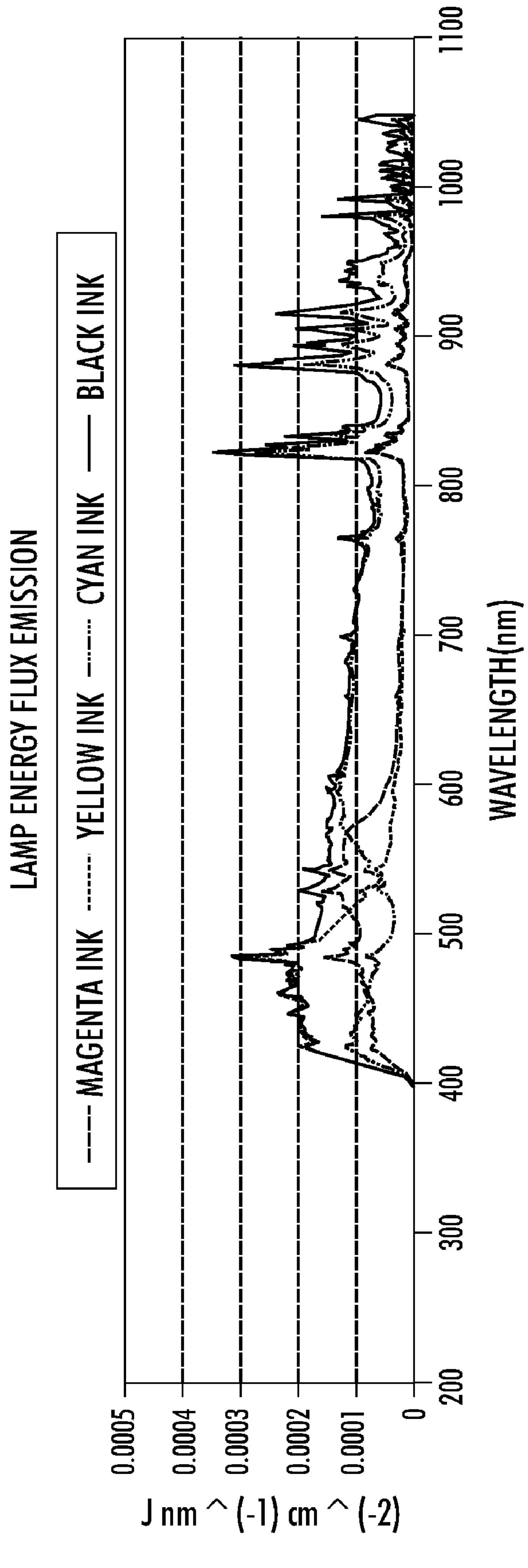
FIG. 15 shows the proportions of the total energy flux emitted by the Type-A Xenon lamp with Acrylite OP-3 filter absorbed by single 600 dpi layers of each of the magenta, yellow, cyan and black inks ejected at a standard drop size.

The larger line width growth for black lines than for cyan lines shown in FIGS. 13 and 14 is due to the larger absorption of the Xenon spectrum by black ink than by cyan ink. FIG. 15 shows the proportions of the total energy flux emitted by the Type-A Xenon lamp with Acrylite OP-3 filter absorbed by single 600 dpi layers of each of the magenta, yellow, cyan and black inks ejected at a standard 21 ng drop size. The proportions, which were obtained by integrating the convoluted emission and absorption spectra over wavelength, are as follows: black: 89%, cyan: 59%, yellow: 38% and magenta: 32%. As shown in FIGS. 13 and 14, the standard deviations of the line widths after flash leveling are generally larger than the as-deposited lines before flash leveling. This result is believed to be due, at least in part, to the non-uniformity of the flash from the linear lamp.

Using a flash lamp to rapidly heat ink to enable rapid reflow leveling on a substrate, with only minor heating of the substrate, can mitigate ink penetration into porous substrates, such as plain paper, to achieve acceptable print-through for applications ranging from the least demanding to the most demanding. In embodiments, the effectiveness of the thermal reflow of ink for leveling can be evaluated based on the amount of line width growth resulting from heating of the ink. For example, thermal reflow may be rated as being acceptable for leveling when a 600 dpi single pixel line of ink is spread from an as-deposited line width of about 60 μm to an as-spread line width of about 100 μm. For solid inks, a line width growth from 60 μm to 100 μm is sufficient to mask defects of weak and misdirected jets up to a severity of a completely missing jet/printed line. In embodiments, an as-leveled line width of 100 μm may be selected as an acceptable value for single pass printing with UV gel inks printed at 600 dpi.

In embodiments of the methods of leveling ink on substrates, it is desirable to produce leveling of the ink on a substrate surface substantially without any simultaneous curing of the ink. Curing will impede leveling of the corrugated structure formed by ink droplet freezing on substrate impingement. If leveling is impeded, then micro-banding will not be effectively mitigated and completely missing lines will not be effectively covered. Curing of the ink results when cross-linking or polymerization reactions occur in the ink. In the embodiments, the radiation source used for leveling the ink is selected to emit radiant energy onto the ink that produces substantially no curing during leveling.

In other embodiments of the methods of leveling ink, a relatively small amount of curing may also occur during the leveling of the ink, in cases where a portion of the emission spectrum of the radiation source may be capable of causing curing in the ink composition being leveled, and this portion is not removed, such as by filtering. However, in those embodiments, the radiation source can emit radiant energy effective to heat the ink to a sufficient temperature to produce leveling while reducing the ink viscosity at a faster rate and/or by a larger magnitude, than any cross-linking or polymerization of the ink can increase the ink viscosity. As a consequence of the ink viscosity being reduced in this manner by a temperature change, any curing that may occur in the ink during leveling substantially does not impede leveling and the desired results of the leveling on the ink can still be achieved. This can be seen in FIG. 14 where the high absorption of radiant energy from a B-Lamp by the black ink results in a sufficient increase in line width (to>100 nm), for effective leveling for all substrates, even though a significant curing dose of UV curing radiation was also incident on the black ink. The same dose of leveling and curing radiation was also incident on the cyan ink in FIG. 13. The line widths were again increased by the leveling radiation, but due to lower absorption of the visible and near-IR leveling radiation by the cyan ink, the viscosity was not as effectively reduced as for the black ink. UV curing radiation was also absorbed and some polymerization/cross-linking occurred, which tended to raise the viscosity of the ink. The net effect is that the curing impeded the leveling and insufficient line width growth was achieved (to<100 nm) to mitigate micro-banding, or to completely cover missing lines.

In embodiments in which curing of the ink is desired to achieve robustness of images on substrates, the ink can be exposed to radiant energy effective to produce the desired curing of the ink composition subsequent to leveling of the ink.

Figure 16:
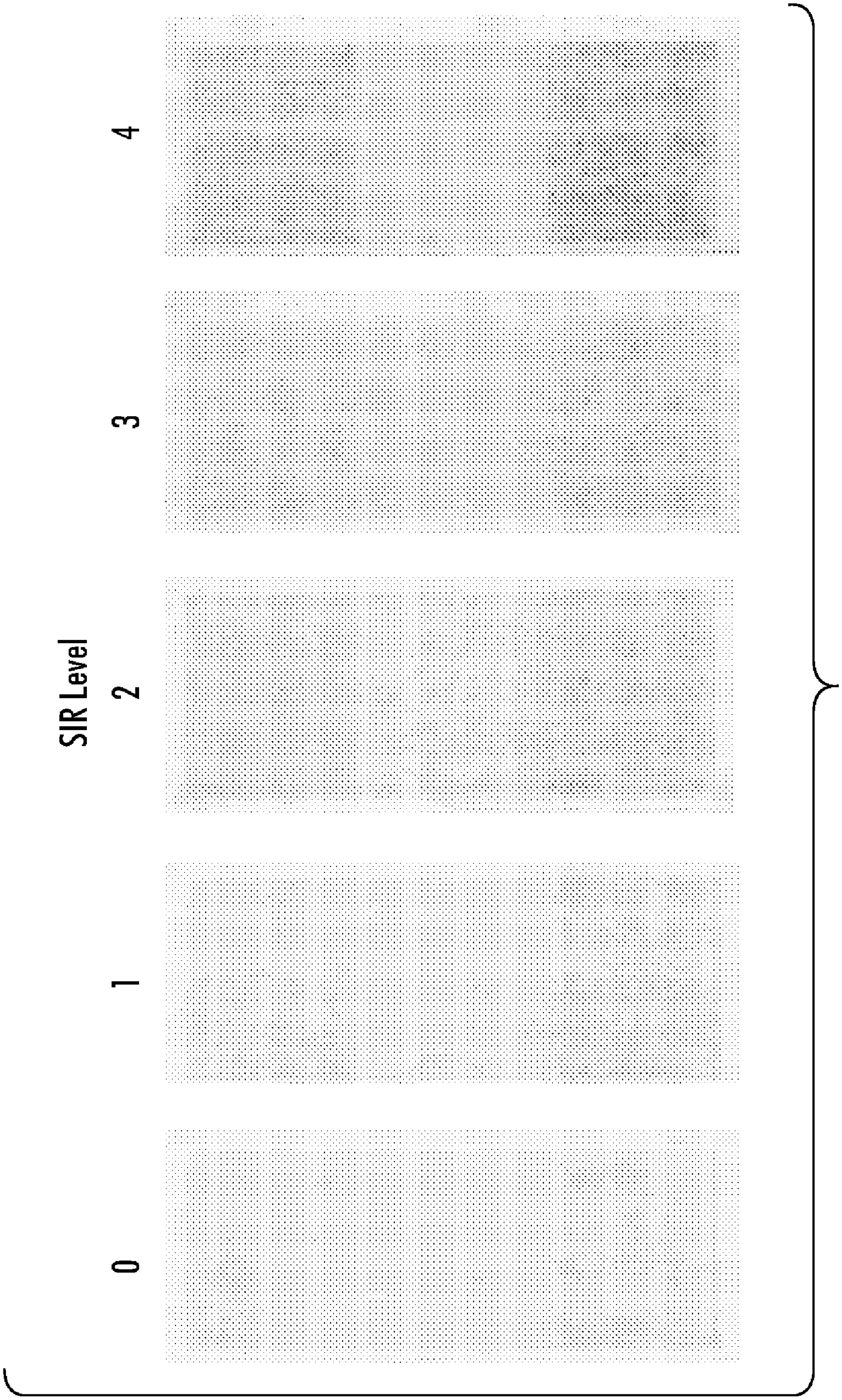
FIG. 16 shows an exemplary standard image reference (SIR) chart for rating the level of ink print-through in porous substrates.

FIG. 16 shows an exemplary standard image reference (SIR) chart that may be used to rate the level of ink print-through in porous substrates, such as plain paper. As shown, the numerical rating scale of the SIR chart ranges from 0 to 4, with 0 representing the least print-through and 4 the most. An SIR value of 0 is judged to be acceptable for all applications; an SIR value of 1 is judged to be acceptable for all but the most demanding applications; an SIR value of 2 is judged to be unacceptable for all but the least demanding applications; an SIR value of 3 is judged to be unacceptable for all applications; and an SIR value of 4 is also judged to be unacceptable for all applications. In general print-through in porous substrates may be judged to be acceptable if a rating of 0 or 1 according the SIR chart is achieved.

DOE's were performed to determine exemplary print process conditions for achieving acceptable line width growth and acceptable print-through of ink deposited on porous substrates. Two plain papers, Xerox 4200 (4200) and Xerox Color Expressions (CX98 with brightness of 98) available from the Xerox Corporation, were used. Xerox 4200 is a higher porosity plain paper, and CX98 is a lower porosity plain paper. The DOE's were run on an apparatus as depicted in FIG. 2. In the apparatus, the paper was supported on a stationary printing platen at the marking device 110 and on a stationary leveling platen at the leveling device 120. The printing platen and leveling platen were cooled using re-circulating glycol temperature controllers. The marking device 110 included print heads to deposit heated cyan and magenta gel inks at 600 dpi in single pixel line widths onto paper. The cyan ink was a high gel (10%)-high wax (10%) ink, and the magenta ink was a standard formulation containing 7.5% gel-5% wax. The leveling device 120 included a Type-A Xenon flash lamp (FIG. 9) with an acrylite OP-3 filter to produce non-contact image leveling of the inks. The filtered emission spectrum of the flash lamp is shown in FIG. 12. Line width growth of the pixel lines resulting from leveling was determined.

Figure 17A:
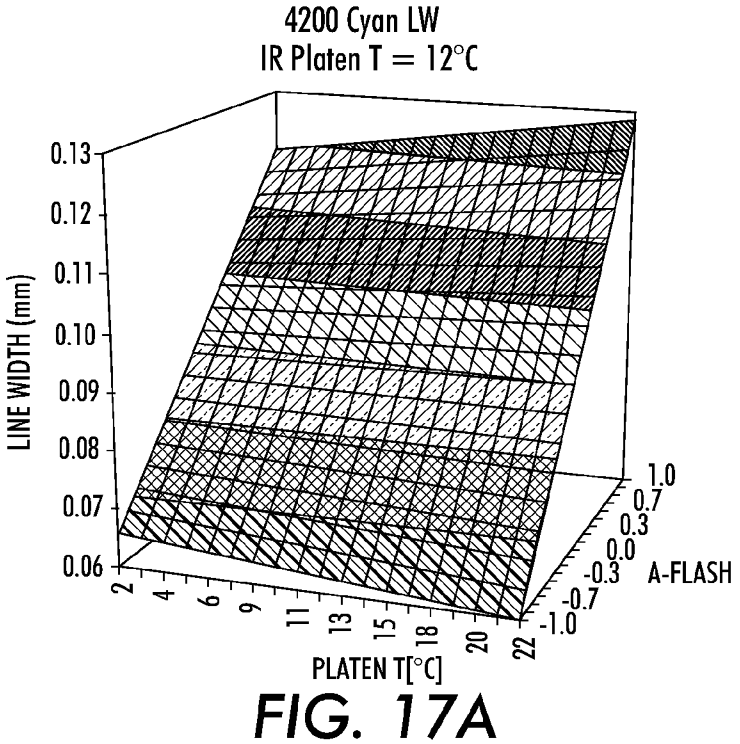
FIGS. 17A and 17B show model fits to line width measurements for a first type of paper for cyan ink (FIG. 17A) and magenta ink (FIG. 17B).
Figure 17B:
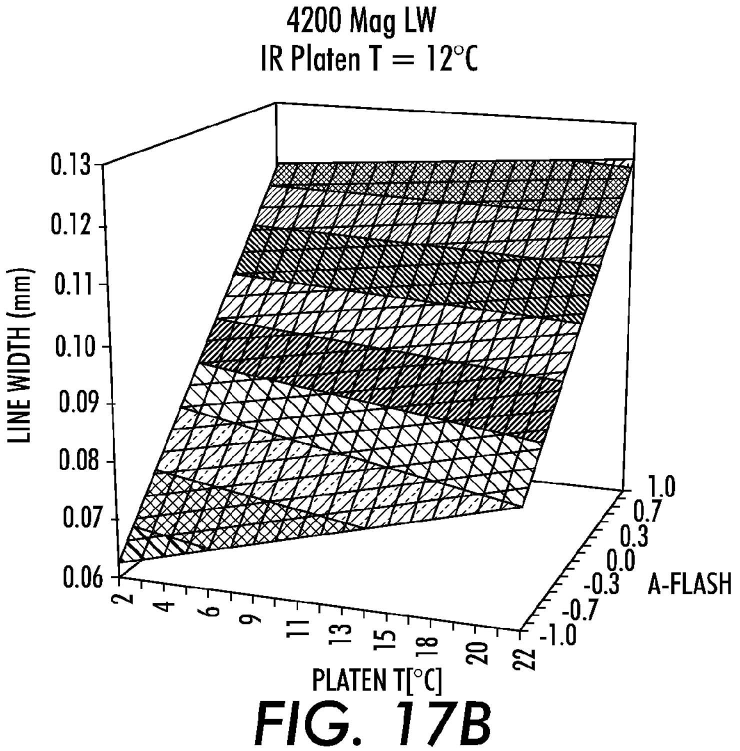
Figure 18A:
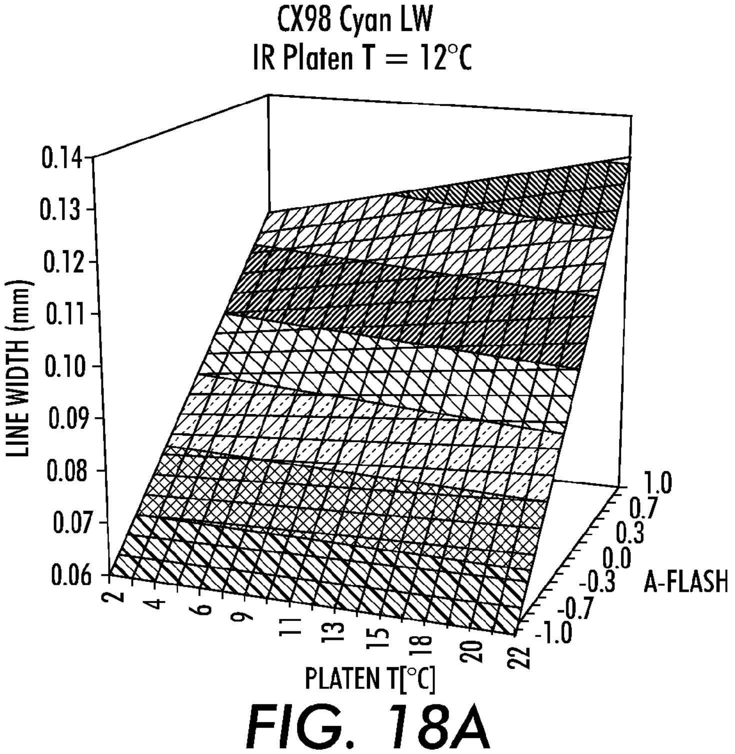
FIGS. 18A and 18B show model fits to line width measurements for a second type of paper for cyan ink (FIG. 18A) and magenta ink (FIG. 18B).
Figure 18B:
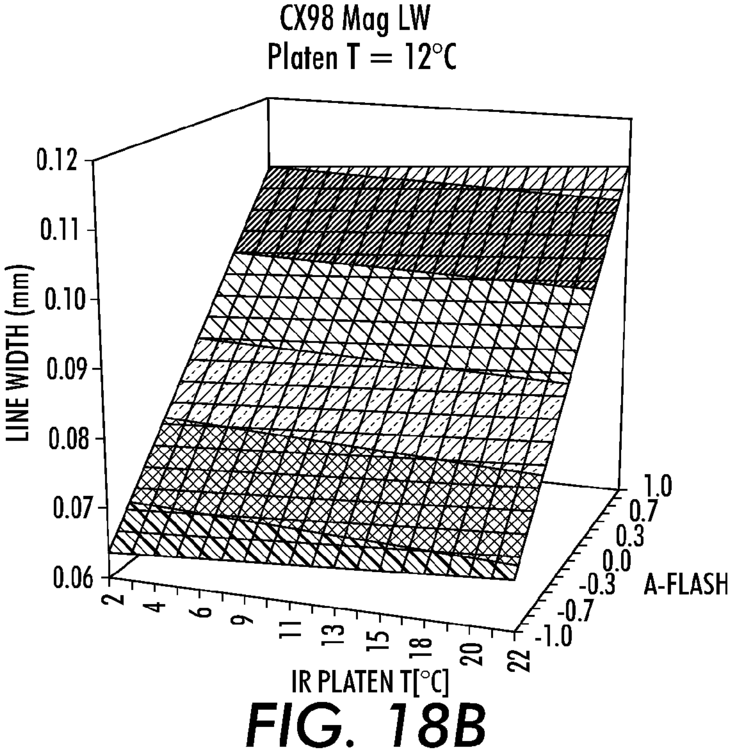

DOE model fits to the line width measurements for the 4200 paper are shown in FIG. 17A for cyan ink and FIG. 17B for magenta ink. DOE model fits to the line width measurements for the CX98 paper are shown in FIG. 18A for cyan ink and FIG. 18B for magenta ink. In FIGS. 17A to 20F, a value of −1.0 for "A-flash" means the flash lamp is turned OFF (with no leveling) and a value of 1.0 for "A-flash" means the flash lamp is turned ON (with leveling). In all of FIGS. 17A to 20F, the "Platen T" refers to the printing platen temperature, and the "IR Platen T" refers to the leveling platen temperature.

Based on the results of the flash leveling experiments on 4200 and CX98 plain papers that can be seen from the DOE model fits in FIGS. 17A, 17B and 18A, 18B, significant line width growth is achieved with the Type-A Xenon flash lamp. Both cyan and magenta line widths show only a very weak dependence on the platen temperature over the range in the DOE. Cyan lines grow from about 60 μm as deposited to about 120 μm to about 130 μm, while magenta lines grow from about 60 μm to about 110 μm, as a result of the flash leveling. According to the criteria described herein, the line growth for both cyan and magenta ink is acceptable to mitigate micro-banding and also to mask defects of weak and misdirected jets up to a severity of a completely missing jet/printed line. The somewhat smaller line width for magenta is believed to be due to the lower absorption of the Type-A Xenon flash lamp flash energy by the magenta ink than for the cyan ink, as shown in FIG. 15. The proportions of the total flash lamp energy absorbed by the cyan and magenta inks were calculated previously to be 59% cyan and 32% magenta.

Figure 19A:
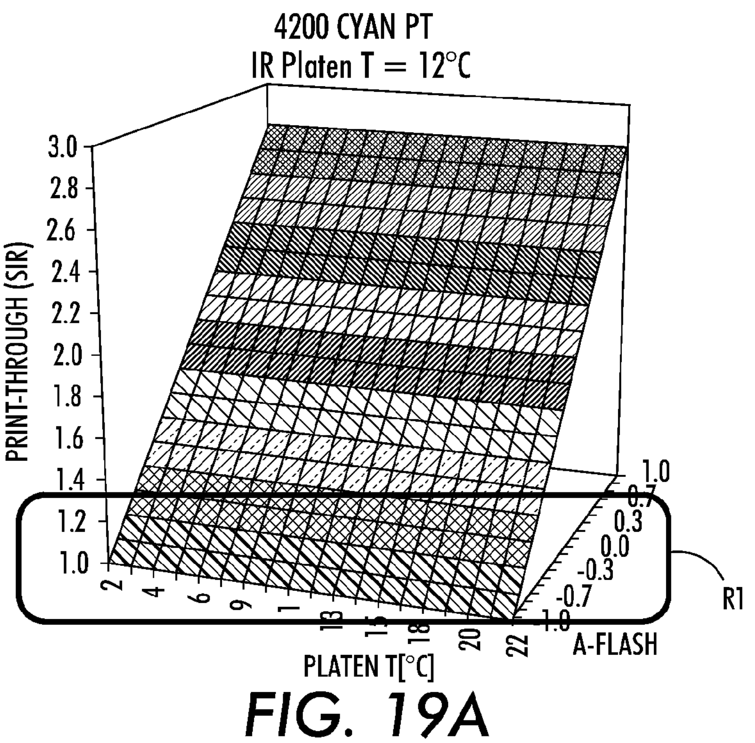
FIGS. 19A and 19C show results for print-through evaluations for DOE's (Design of Experiments) with the first type of paper for cyan ink (FIG. 19A) and cyan+magenta inks (i.e., blue ink) (FIG. 19C), with FIG. 19B reproducing FIG. 17A.
Figure 19B:
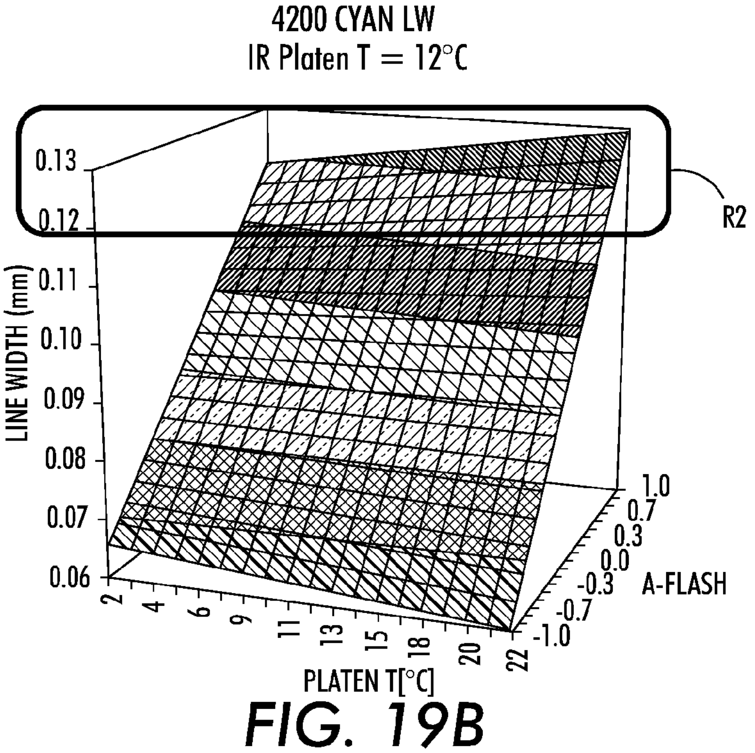

The ink print-through for 100% coverage patches of cyan and magenta primary colors and of blue (cyan+magenta) secondary color was also determined from the DOE's. The results for the print-through evaluations for the DOE's with 4200 paper are shown in FIG. 19A for cyan ink and 19C for cyan+magenta inks (i.e., blue ink). FIG. 19B reproduces FIG. 17A for the line width growth for cyan ink. In FIGS. 19A and 19B, the leveling platen temperature is kept constant at 12° C., and in FIG. 19C, the printing platen temperature is kept constant at 12° C. In FIG. 19A, a "region of acceptable print-through" is indicated, R1. In FIG. 19B, a "region of acceptable line width" is indicated, R2.

Figure 19C:
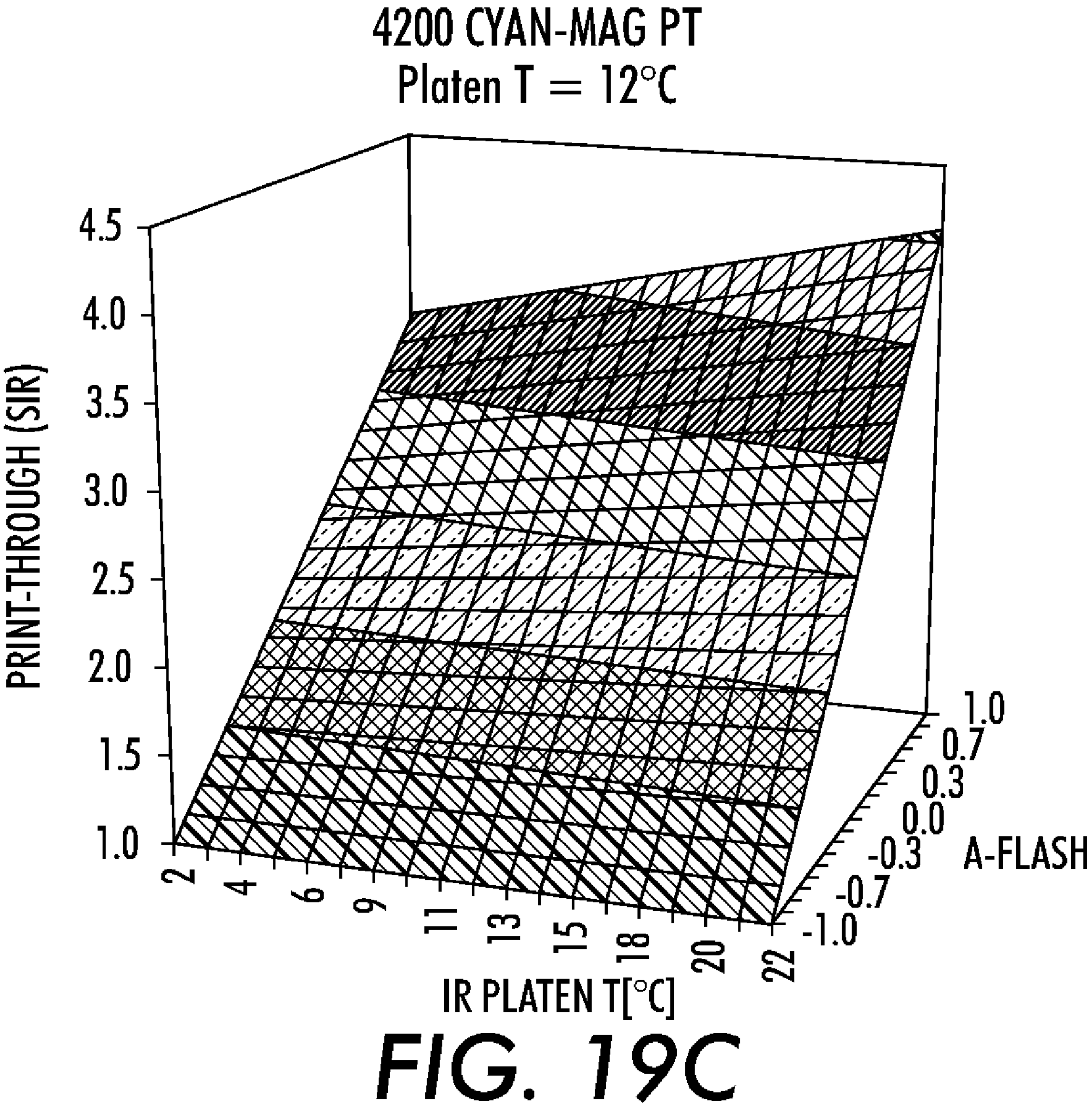

Based on the results of the flash leveling tests on 4200 plain paper indicated from the DOE model fits in FIGS. 19A to 19C, print-through is acceptable for all but the most demanding applications for both primary and secondary colors without leveling. (The result for magenta is very similar to that for cyan and is not shown.) The SIR values without leveling are all about 1 (FIGS. 19A, 19C). With leveling by the flash lamp, both primary and secondary colors have unacceptable print-through. The SIR values for primary colors are all about 3 and for secondary colors the ratings reach up to a value of 4 (FIGS. 19A, 19C).

Regions of both acceptable line width and acceptable print-through do not overlap, as seen by comparing region R1 in FIG. 19A with region R2 in FIG. 19B, in which the cyan print-through and cyan line width functional dependencies are plotted against the same leveling platen temperature and A-flash axes and with the same constant leveling platen temperature of 12° C. Acceptable print-through values occur in the indicated flash-OFF region (FIG. 19A) and acceptable line width values occur in the indicated flash-ON region (FIG. 19B). Even at a leveling platen temperature of 2° C., the print-through is only marginally acceptable in the flash-OFF region over the full range of platen temperatures. In this region, the line width is too narrow to mitigate micro-banding or to cover missing lines. Acceptable print-through only occurs in the flash-OFF region and acceptable line widths only occur in the flash-ON region with no overlap.

Figure 20A:
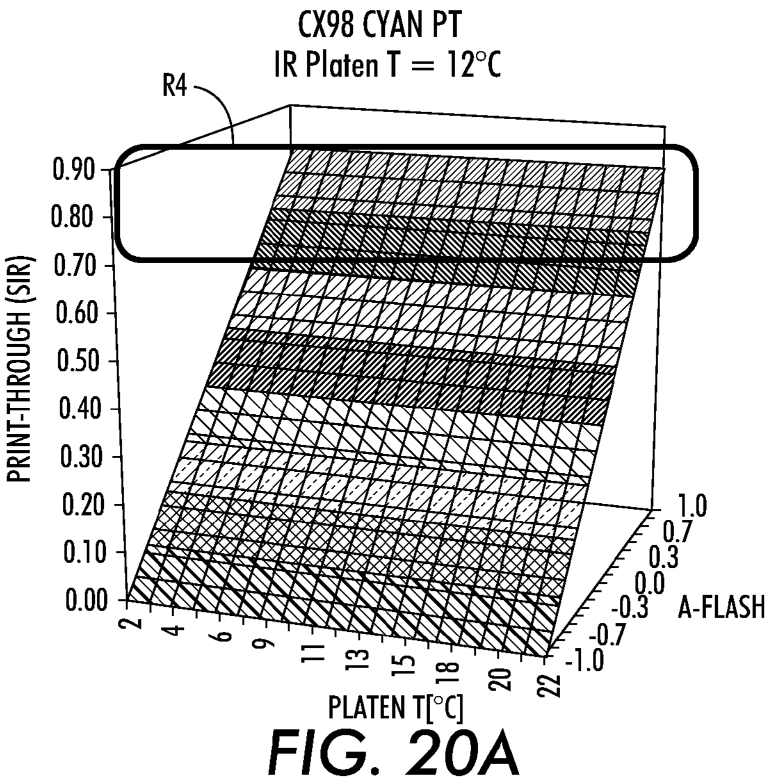
FIGS. 20A, 20C, 20D and 20E show results for print-through evaluations for the DOE's with the second type of paper for cyan ink (FIGS. 20A and 20E) and cyan+magenta inks (FIGS. 20C and 20D), with FIG. 20B reproducing FIG. 18A and FIG. 20F showing the results for the line width evaluation for cyan ink at a reduced leveling platen temperature over that shown in FIG. 20B.
Figure 20B:
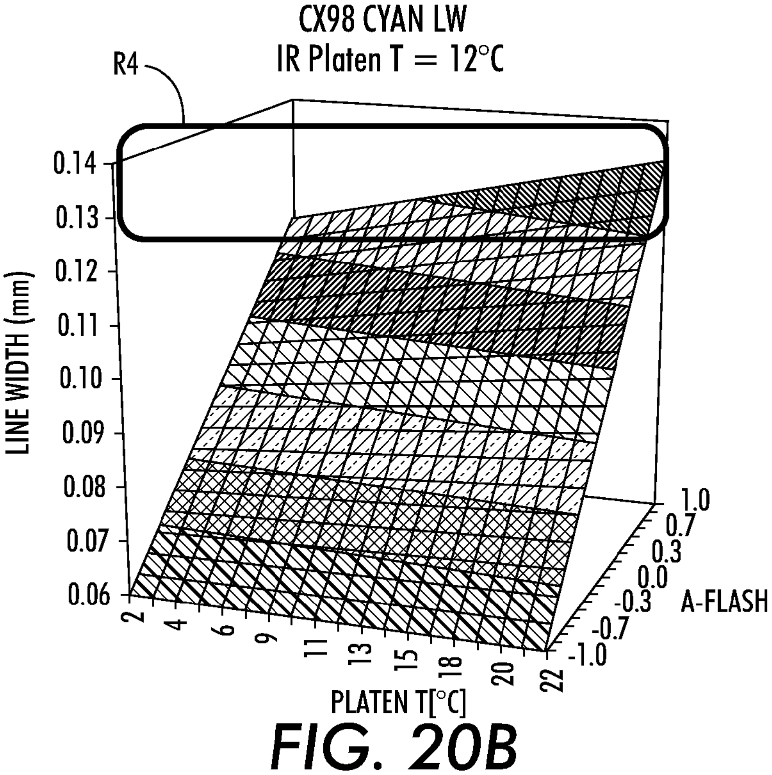
Figure 20C:
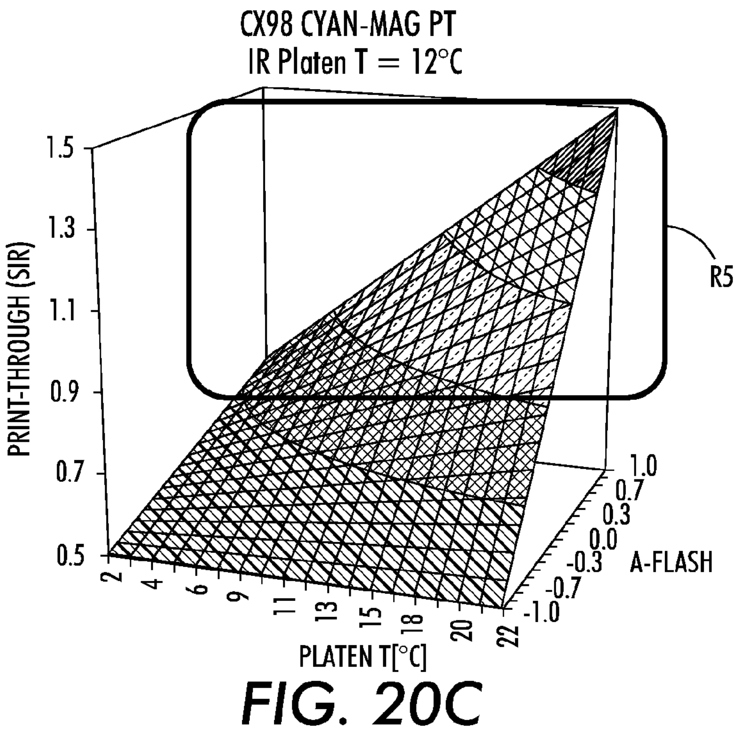
Figure 20D:
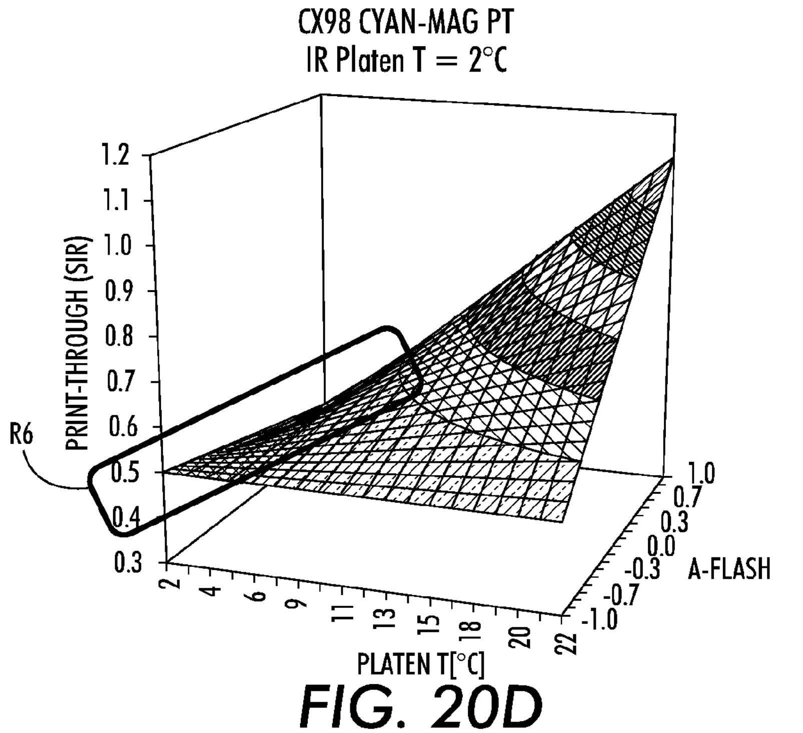
Figure 20E:
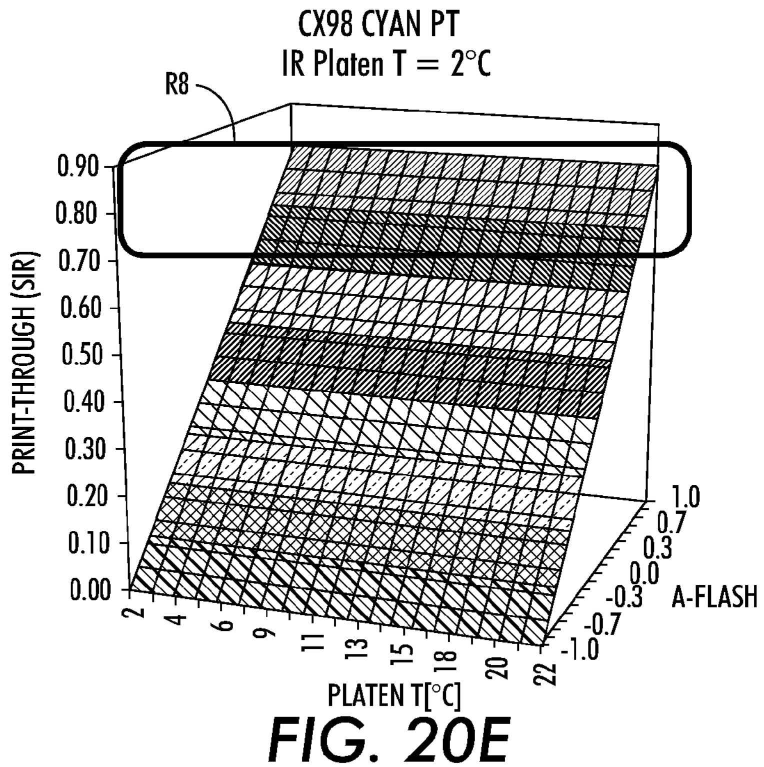
Figure 20F:
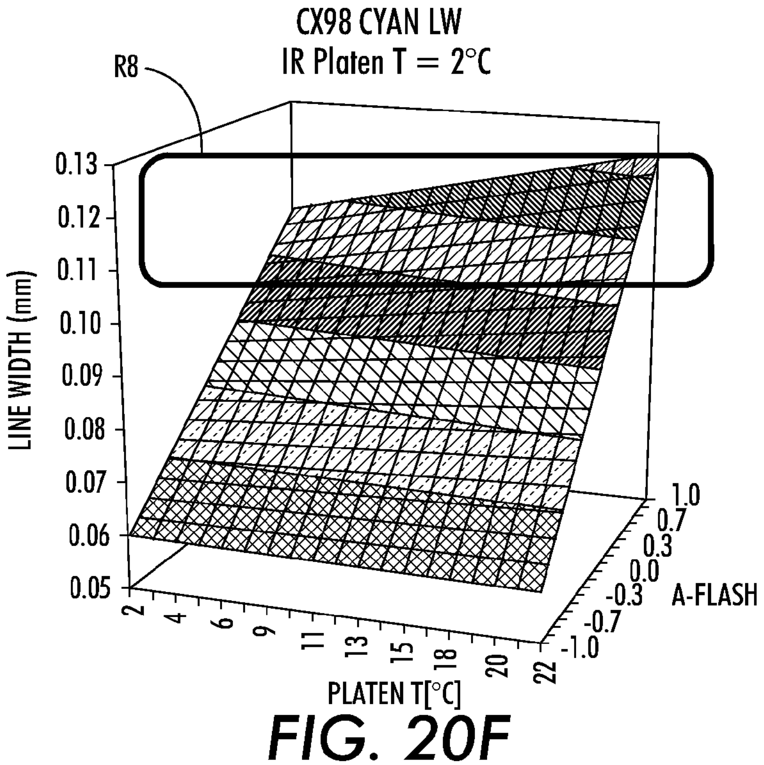

The results for the print-through evaluations for the DOE's with CX98 paper are shown in FIGS. 20A and 20E for cyan ink and in FIGS. 20C and 20D for cyan+magenta inks (blue ink). FIG. 20B reproduces FIG. 18A for the line width growth for cyan ink at a leveling platen temperature of 12° C., and FIG. 20F shows the cyan line width growth for a reduced leveling platen temperature of 2° C. In FIGS. 20A, 20B and 20C, the leveling platen temperature is kept constant at 12° C., and in FIGS. 20D, 20E and 20F, the leveling platen temperature is kept constant at 2° C. In both FIG. 20A and FIG. 20B, a region of both acceptable line width and acceptable print-through with the leveling flash-ON is indicated, R4. In FIG. 20C, a region of unacceptable print-through is indicated, R5. In FIG. 20D, a region of acceptable print-through" is indicated, R6. In both FIGS. 20E and 20F, a region of both acceptable line width and acceptable print-through for cyan ink with leveling flash-ON is indicated, R8.

Based on the results of the flash leveling tests on CX98 paper indicated from the DOE model fits in FIGS. 20A to 20F, print-through ratings for leveled prints on CX98 paper are acceptable for cyan and magenta primary colors as shown in FIG. 20A. (The result for magenta is very similar to that for cyan and is not shown.) This same region is also a region of acceptable line width for leveling as shown in FIG. 20B, as both functional dependencies are plotted against the same platen temperature and A-flash axes and with the same constant leveling platen temperature of 12° C.

Print-through ratings for primary colors depend largely on flash energy, while secondary color ratings also have a dependence on platen temperatures. This finding can be seen by comparing FIG. 20A with FIGS. 20C and 20D.

For secondary color blue (cyan+magenta) with the leveling platen temperature at 12° C., the leveled prints show marginal to unacceptable print-through for the full platen temperature range in R5 of 2° C. to 22° C., as seen in FIG. 20C.

For secondary color blue with the printing platen and leveling platen both at a temperature of 2° C., acceptable print-through is achieved for both leveled and unleveled prints in R6, as seen in FIG. 20D.

To ensure that holding both platen temperatures at 2° C. still yields a region of both acceptable line width and acceptable print through for primary colors (R4 in FIGS. 20A and 20B), the DOE model results are plotted for a leveling platen temperature of 2° C. for cyan print-through in FIG. 20E and for the cyan line width in FIG. 20F. A common region of both acceptable line width and acceptable print-through is maintained in region R8. The results show that for plain paper CX98, both acceptable print-through and acceptable line widths are achieved with flash leveling for both primary and secondary colors, when both the printing platen and the leveling platen are held at 2° C.

It will be appreciated that various ones of the above-disclosed, as well as other features and functions, or alternatives thereof, may be desirably combined into many other different systems or applications. Also, various presently unforeseen or unanticipated alternatives, modifications, variations or improvements therein may be subsequently made by those skilled in the art, which are also intended to be encompassed by the following claims.

What is claimed is:

1. A method of leveling ink on a substrate, the method comprising irradiating ink disposed on a first surface of a porous substrate with radiation emitted by at least one flash lamp, the radiation flash heating the ink to at least a viscosity threshold temperature of the ink to allow the ink to flow laterally on the first surface to produce leveling of the ink, the ink being heated sufficiently rapidly that heat transfer from the ink to the substrate is sufficiently small during the leveling that ink at the substrate interface is cooled to a temperature below the viscosity threshold temperature thereby preventing any significant ink permeation into the substrate from the first surface.

2. The method of claim 1, wherein:

the ink disposed on the first surface of the substrate has a corrugated structure and a printed line width; and the leveling increases the line width of the ink.

3. The method of claim 1, wherein the ink has a viscosity range of about $10^1$ to about $10^6$ cP over a temperature range of less than about 40 Celcius degrees.

4. The method of claim 1, wherein the substrate comprises paper and the ink is a gel ink.

5. The method of claim 1, wherein substantially no curing of the ink is produced by irradiating the ink with the radiation emitted by the at least one flash lamp.

6. The method of claim 1, wherein the radiation emitted by each flash lamp has an emission spectrum falling within the visible-infrared portion of the electromagnetic spectrum.

7. The method of claim 1, wherein the ink is an ultraviolet light (UV) curable ink.

8. The method of claim 7, further comprising, subsequent to leveling of the ink, irradiating ink on the first surface of the substrate with UV radiation emitted by a radiant energy source to cross-link the ink.

9. The method of claim 1, wherein the radiation emitted by the at least one flash lamp is reflected onto the ink on the first surface of the substrate by a reflector.

10. The method of claim 1, wherein:

each flash lamp comprises a Type-A Xenon flash lamp; and the radiation emitted by each flash lamp is filtered to substantially remove a portion of the emission spectrum having a wavelength of less than about 400 nm before irradiating the ink.

11. The method of claim 1, further comprising:

heating the ink to a temperature greater than the viscosity threshold temperature; and applying the heated ink to the first surface of the substrate with at least one print head.

12. The method of claim 1, wherein the substrate is stationary relative to at least one flash lamp while irradiating the ink with the radiation.

13. The method of claim 1, wherein the substrate is moved relative to the at least one flash lamp while irradiating the ink with the radiation.

14. The method of claim 1, further comprising:

cooling a second surface of the substrate opposite to the first surface while irradiating the ink with the radiation; and optionally cooling the second surface of the substrate while the ink is being applied onto the first surface prior to leveling the ink.

15. A method of leveling ink on a substrate, the method comprising irradiating a gel ink disposed on a first surface of a substrate with radiation emitted by at least one flash lamp, the first surface being non-permeable with respect to the gel ink, the radiation flash heating the gel ink to at least a viscosity threshold temperature of the gel ink to allow the gel ink to flow laterally on the first surface to produce leveling of the gel ink.

16. The method of claim 15, further comprising:

heating the gel ink to a temperature greater than the viscosity threshold temperature; and applying the heated gel ink to the first surface of the substrate with at least one print head.

17. The method of claim 15, further comprising:

cooling a second surface of the substrate opposite to the first surface while irradiating the gel ink with the radiation; and optionally cooling the second surface of the substrate while the gel ink is being applied onto the first surface prior to leveling the gel ink.

18. The method of claim 15, wherein each flash lamp comprises a Type-A Xenon flash lamp, and the radiation emitted by each flash lamp is filtered to substantially remove a portion of the emission spectrum having a wavelength of less than about 400 nm before irradiating the gel ink.

19. The method of claim 15, wherein:

the gel ink disposed on the first surface of the substrate has a corrugated structure and a printed line width; and the leveling increases the line width of the gel ink.

20. The method of claim 15, wherein substantially no curing of the gel ink is produced by irradiating the gel ink with the radiation emitted by the at least one flash lamp.

21. The method of claim 15, further comprising, subsequent to leveling of the gel ink, irradiating the gel ink on the first surface of the substrate with UV radiation emitted by a radiant energy source to cross-link the gel ink.

* * * * *